(12) United States Patent
Findlay

(10) Patent No.: US 11,126,148 B2
(45) Date of Patent: Sep. 21, 2021

(54) ONLINE MIGRATION TOOL AND USE THEREOF

(71) Applicant: CIMA PLUS INC., Laval (CA)

(72) Inventor: David Findlay, Calgary (CA)

(73) Assignee: CIMA PLUS INC., Quebec (CA)

( * ) Notice: Subject to any disclaimer, the term of this patent is extended or adjusted under 35 U.S.C. 154(b) by 457 days.

(21) Appl. No.: 16/314,703

(22) PCT Filed: Jul. 7, 2017

(86) PCT No.: PCT/CA2017/000167
§ 371 (c)(1),
(2) Date: Jan. 2, 2019

(87) PCT Pub. No.: WO2018/006156
PCT Pub. Date: Jan. 11, 2018

(65) Prior Publication Data
US 2019/0258210 A1    Aug. 22, 2019

Related U.S. Application Data

(60) Provisional application No. 62/360,045, filed on Jul. 8, 2016.

(51) Int. Cl.
*G05B 7/02* (2006.01)
*H05K 7/14* (2006.01)

(52) U.S. Cl.
CPC .............. *G05B 7/02* (2013.01); *H05K 7/1484* (2013.01)

(58) Field of Classification Search
None
See application file for complete search history.

(56) References Cited

U.S. PATENT DOCUMENTS

2013/0218306 A1    8/2013  Polzer

FOREIGN PATENT DOCUMENTS

WO    2008013520 A1    1/2008

OTHER PUBLICATIONS

International Search Report for PCT/CA2017/000167 dated Nov. 10, 2017.

*Primary Examiner* — Carlos R Ortiz Rodriguez
(74) *Attorney, Agent, or Firm* — Langer, Grogan & Diver, P.C.; Robert S. Silver; Joseph F. Murphy

(57) ABSTRACT

A migration tool, and the use thereof, for replicating and/or migrating at least one signal, associated with at least one field device, from a pre-existing control system to an external system or new control system, comprising: at least one analog sub-assembly, capable of relaying said at least one signal wherein said at least one signal is an analog signal; at least one discrete sub-assembly capable of relaying said at least one signal wherein said at least one signal is a discrete signal; a first selector for switching said at least one signal between (i) an analog mode where said at least one signal is directed to said at least one analog sub-assembly, and (ii) a discrete mode where said at least one signal is directed to said at least one discrete sub-assembly.

35 Claims, 25 Drawing Sheets

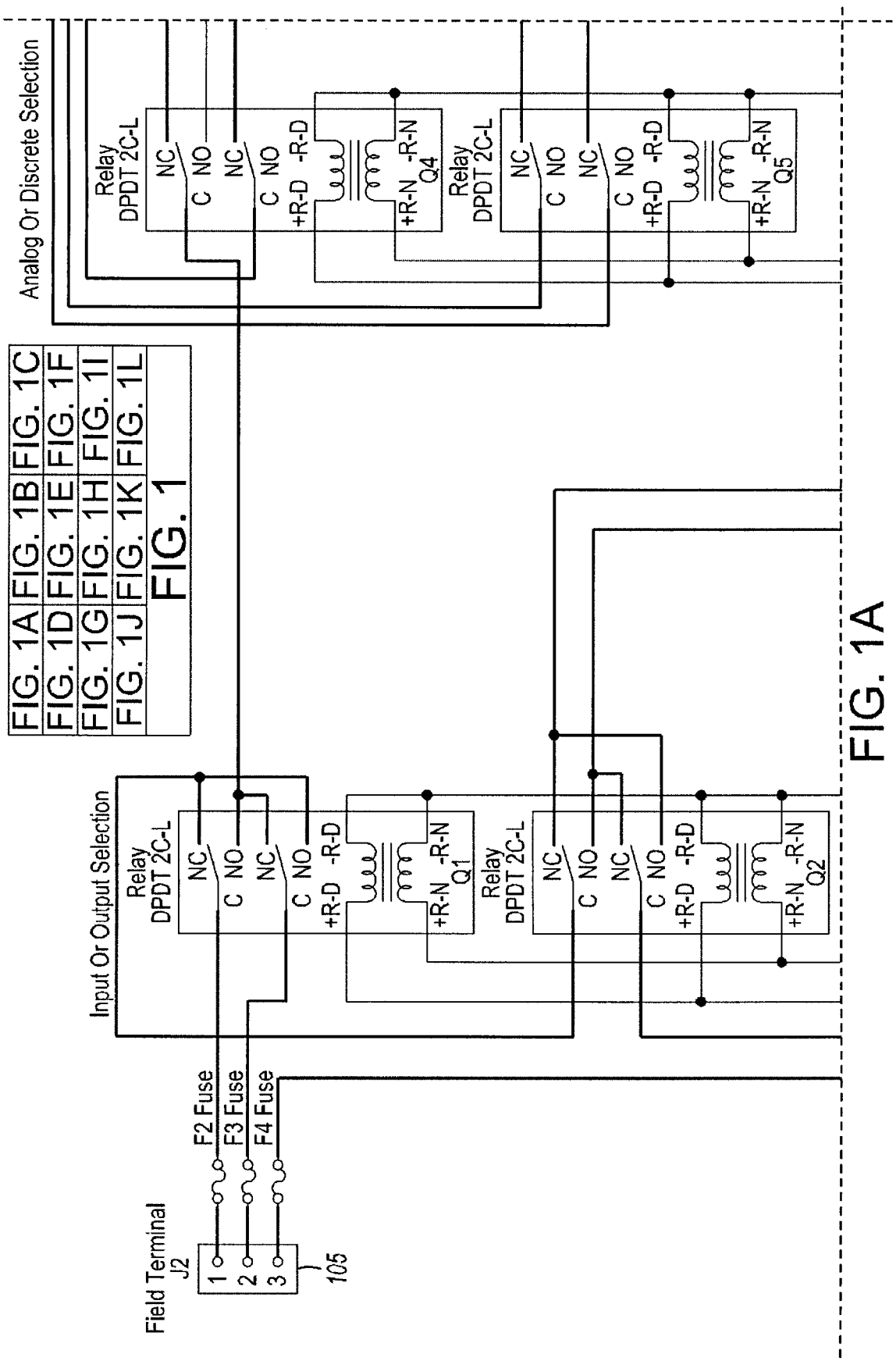

Fabrication Step 1

Fabrication Step 2

Final Assembly Step 3

ONLINE MIGRATION TOOL AND USE THEREOF

CROSS-REFERENCE TO RELATED APPLICATIONS

This application is a U.S. National Phase Application of PCT/CA2017/000167, filed Jul. 7, 2017 which claims priority to U.S. Provisional Application No. 62/360,045, filed Jul. 8, 2016, the contents of which applications are incorporated herein by reference in their entireties for all purposes.

FIELD OF DISCLOSURE

This disclosure relates to the field of industrial control system upgrades, and more precisely it relates to a tool and a method facilitating the migration of an existing industrial control system to a new platform (new control system) or an upgraded platform (upgraded control system) without the need to shut down the controlled environment's production.

BACKGROUND OF THE INVENTION

Today, electronic signals, whether analog or discrete, or a combination of both, are used to monitor and control a plurality of devices in various environments, such as, but not limited to industrial plants, such as factories, water treatment plants, nuclear centrals and any such plants wherein a number of parameters are monitored and equipment needs to be remotely controlled. Such monitoring and control requires receiving at least one signal from various field devices (or external devices and/or systems) (such as, but not limited to thermometers/temperature measurement devices, manometers/pressure measurement devices, level measurement devices, flow measurement devices, analytical measurement devices, electrical energy measurement devices, and contacts and coils) and sending at least one signal to various field devices (or external devices and/or systems) (such as, but not limited to valves, electrical relays, and motors).

When replacement of the monitoring and/or control system of such an environment or plant is required, such as when an upgrade or replacement of such monitoring and/or control system is required, it is important to be able to minimize the interruption time between the moment where the monitored and/or controlled environment equipment or plant is monitored and/or controlled by the old system and the moment where the equipment or plant is monitored and/or controlled by the new or upgraded system. Such replacement procedure is often referred to as a system migration procedure. For some applications and situations, it is not possible to wait for long (or any) delays in order to redirect the wiring from the old controller (monitoring and/or control system) to the new controller (monitoring and/or control system), such as downtime of monitoring and/or controlling of a plant or equipment. Such interruption may have undesirable effects. In order to alleviate this problem, it is therefore preferable to have a device, or plurality of devices, which allows operating a swing-over, preferably a reversible swing-over, more preferably a fully reversible swing-over, from the old (or existing) controller to the new (or upgraded) controller, or old (or existing) system components to new (or upgraded) system components, with minimal interruption, preferably the swing-over is an instantaneous swing-over.

Existing signal replicating devices are restricted to discrete signals, while others are limited to analog signals. In the same manner, some devices are designed to operate only in a specific range of voltage. Therefore, when having to deal with a plurality of field devices, whether monitored or controlled, it may be required to use various type of devices, each for a specific type of signal. Operating a minimal interruption and/or a simultaneous swing-over with various devices is sometimes difficult given such specific devices may not be designed to interact together and swing-over may not be synchronous. Also, the process to prepare a migration procedure may be time consuming if which type of tool, for each field device, must be determined in advance.

Therefore, there is a need for a migration tool facilitating the wiring of the new control system with minimal disruption of, preferably without disrupting, the pre-existing control system and its associated existing wiring and associated devices that are controlled and/or monitored, preferably having the ability to handle various output and input signals. Preferably, the migration tool is a temporary hardware installation. There is also a need for a method to use such migration tool to tap into wiring of a pre-existing control system, bypassing and replicating a signal, or a plurality of signals, to test and commission a new control system, with minimal disruption of the controlled and/or monitored environment.

SUMMARY OF THE INVENTION

When used herein, the term control system also includes control and/or monitoring system.

When used herein, the term existing control system also includes pre-existing control system, first control system or old control system.

When used herein, the term new control system also includes second control system or replacement or upgraded control system.

According to one aspect, there is provided a migration tool for migrating at least one signal, associated with at least one field device, from a pre-existing control and/or monitoring system to a new (or replacement) control and/or monitoring system, said migration tool comprising: at least one analog sub-assembly, capable of relaying said at least one signal wherein said at least one signal is an analog signal; at least one discrete sub-assembly capable of relaying said at least one signal wherein said at least one signal is a discrete signal; a first selector for switching said at least one signal between (i) an analog mode where said at least one signal is directed to said at least one analog sub-assembly, and (ii) a discrete mode where said at least one signal is directed to said at least one discrete sub-assembly; a second selector for selecting said at least one signal for (i) outputting to said at least one field device, or (ii) inputting from said at least one field device; whereas when said second selector is for selecting said at least one signal for inputting from said at least one field device, both said pre-existing control system and said new control system receive replicates of said at least one signal; and whereas when said second selector is for selecting said at least one signal for outputting to said at least one field device, there is provided a third selector for selecting said at least one signal for relaying to said at least one field device from (i) said pre-existing control system, or (ii) said new control system.

In various alternatives, said migration tool further comprise a voltage range selector for said at least one signal when said signal is a discrete signal to select between an operational voltage range of 120V+/−20% AC and an operational voltage range of from about 5 to about 30 V DC, typically 24V DC. In one alternative, said at least one discrete sub-assembly may further comprise: at least a first relay, preferably a first electronic relay, more preferably a first plurality of electronic relays to repeat said at least one signal at said operational voltage range of 120V+/−20% AC and at least a second relay, preferably a second electronic relay, more preferably a second plurality of electronic relays to repeat said at least one signal at said operational voltage range of from about 5 to about 30 V DC, typically 24V DC.

In various alternatives, said at least one analog sub-assembly further comprises at least one current loop isolation conditioner to replicate at least one signal. Said at least one current loop isolation conditioner can also act as its own load, to allow sensing of said at least one field device by said pre-existing control system and/or by said new control system.

In various alternatives, each of said first selector, said second selector, said third selector and said voltage range selector are each at least one mode selector. In one alternative, each at least one mode selector is a pushbutton. Preferably, at least one pushbutton with feedback, preferably at least one light emission diode feedback and latching relay. Other mode selectors may comprise a switch, software interface, touchscreen or other mode selectors known to persons of ordinary skill in the art.

In various alternatives, said migration tool can further comprise a signal buffering sub-assembly capable of buffering said at least one signal; and a buffering selector for enabling and disabling operation of said signal buffering sub-assembly.

Other alternatives include the migration tool as described herein, whereas said at least one analog sub-assembly and said at least one discrete sub-assembly are enclosed in a housing. In one alternative, a plastic housing. Said housing allowing the migration tool to be stackable one atop another. Said housing further comprising at least one top and at least one bottom.

Said migration tool may further comprise at least one power connector for providing power to said migration tool, preferably on the at least one top and on the at least one bottom of said housing providing said migration tool with power, and allowing said migration tool to be inter-connectable, preferably in parallel with at least one power connector of another migration tool, preferably immediately adjacent said migration tool, preferably in a stack array. In some alternatives, said migration tool comprises a plurality of power connectors.

According to another aspect, there is provided use of the migration tool described herein, further comprising at least one cable, preferably a plurality of cables, for tapping into at least one existing wiring from at least one field device to a pre-existing control system, preferably bypassing and preferably replicating said at least one signal through said migration tool, allowing function testing and commissioning of a new control system while said pre-existing control system is actively controlling required outputs to said at least one field device. In one alternative, said at least one cable may be a cable designed to tap into existing wiring without interfering with the pre-existing control system. The migration tool may therefore, in some alternatives, further comprise at least one tapping cable, in one alternative a plurality of tapping cables, each of said tapping cables comprising at least one terminal for connecting to the migration tool, a cable body, and a probe, preferably a pierce probe for tapping into existing wiring, preferably a wire, carrying said at least one signal, whereas said probe further comprises a threaded end connectable to said cable body and allowing said cable body to spin freely inside said threaded end; a needle to gain and maintain continuity with said at least one signal, operatively coupled to said cable body; and a wire holder, preferably a wire clamp (which may be threaded) to hold said wire against said needle.

In further alternatives, the migration tool may be used to replicate at least one signal toward an external system other than a control system, by using an external system instead of the new control system in the herein descriptions. For such alternatives, yet another aspect is to provide for the use of the migration tool described herein, further comprising at least one cable for tapping into existing wiring from said at least one field device to said pre-existing control system, preferably bypassing and preferably replicating said at least one signal through said migration tool, forming at least one replicated signal and allowing function testing of the replicated signal on said external system. Such external system may include a plurality of signal measurement devices and/or measurement analysis tools.

In one alternative, the migration tool is used to perform migration of at least one signal, preferably a plurality of signals, from a first control system to another control system. The migration tool comprises means to select at least one parameter, preferably a plurality of parameters, for the migration process to be performed by the migration tool, the at least one parameter including: (a) migration of at least one output and/or at least one input signal; (b) at least one analog and/or discrete signal; (c) at least one 120V+/−20% AC and/or from about 5 to about 30 V DC, typically 24V DC signal for at least one discrete signal. The migration tool may include other parameters, including signal buffering or no signal buffering. In one alternative, at least one parameter mode, preferably a plurality of parameter modes are selected via a mode selector, preferably via the use of a mode pushbutton, preferably each mode pushbutton further comprising feedback, preferably LED feedback, and at least one latching relay, preferably a plurality of latching relays, for directing the at least one signal, preferably a plurality of signals to the corresponding subassemblies. Other mode selectors may comprise a switch, a software interface, touchscreen or other mode selectors known to persons of ordinary skill in the art. Combinations of these various parameters are possible, allowing any combination of the above settings for a single migration tool.

Another mode selection is a primary/secondary selection. This selection mode swaps the primary signal (the one in control) to the new control system wires. This is accomplished, in one alternative, with latching relays and LED feedback as discussed herein. However, as discussed above, other mode selectors may comprise a switch, a software interface, touchscreen or other modes selectors known to persons of ordinary skill in the art.

BRIEF DESCRIPTION OF THE FIGURES

FIGS. 1A to 1L is the schematic electronic layout of the motherboard of a migration tool according to one alternative.

DETAILED DESCRIPTION OF THE PREFERRED EMBODIMENTS

Figure 1B:
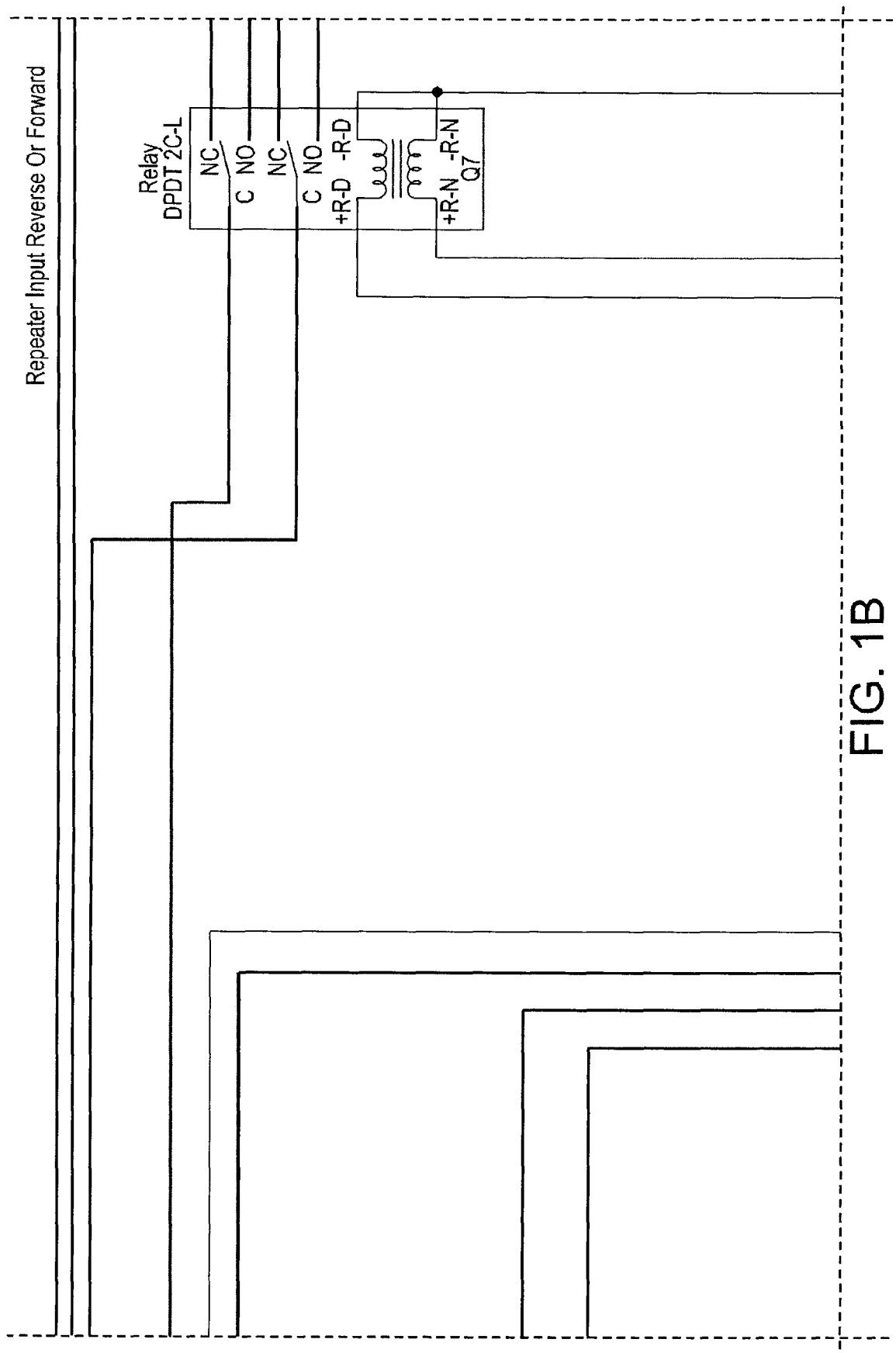
Figure 1C:
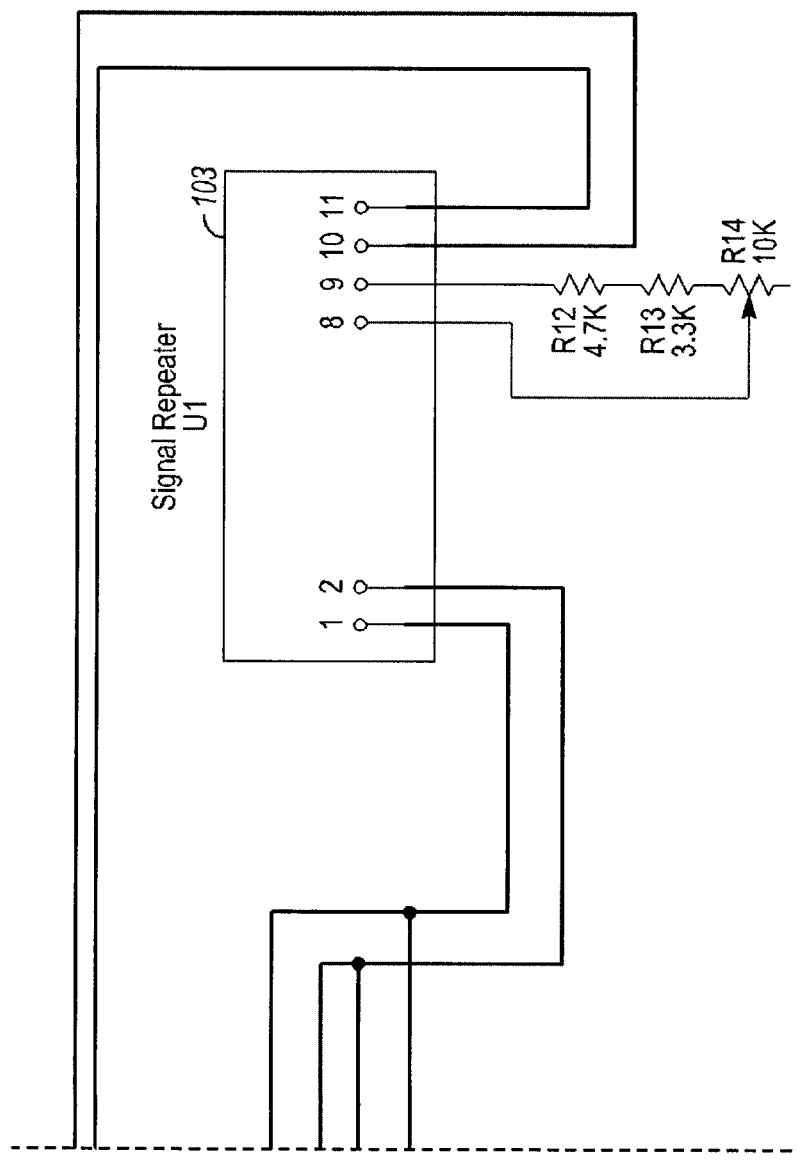
Figure 1D:
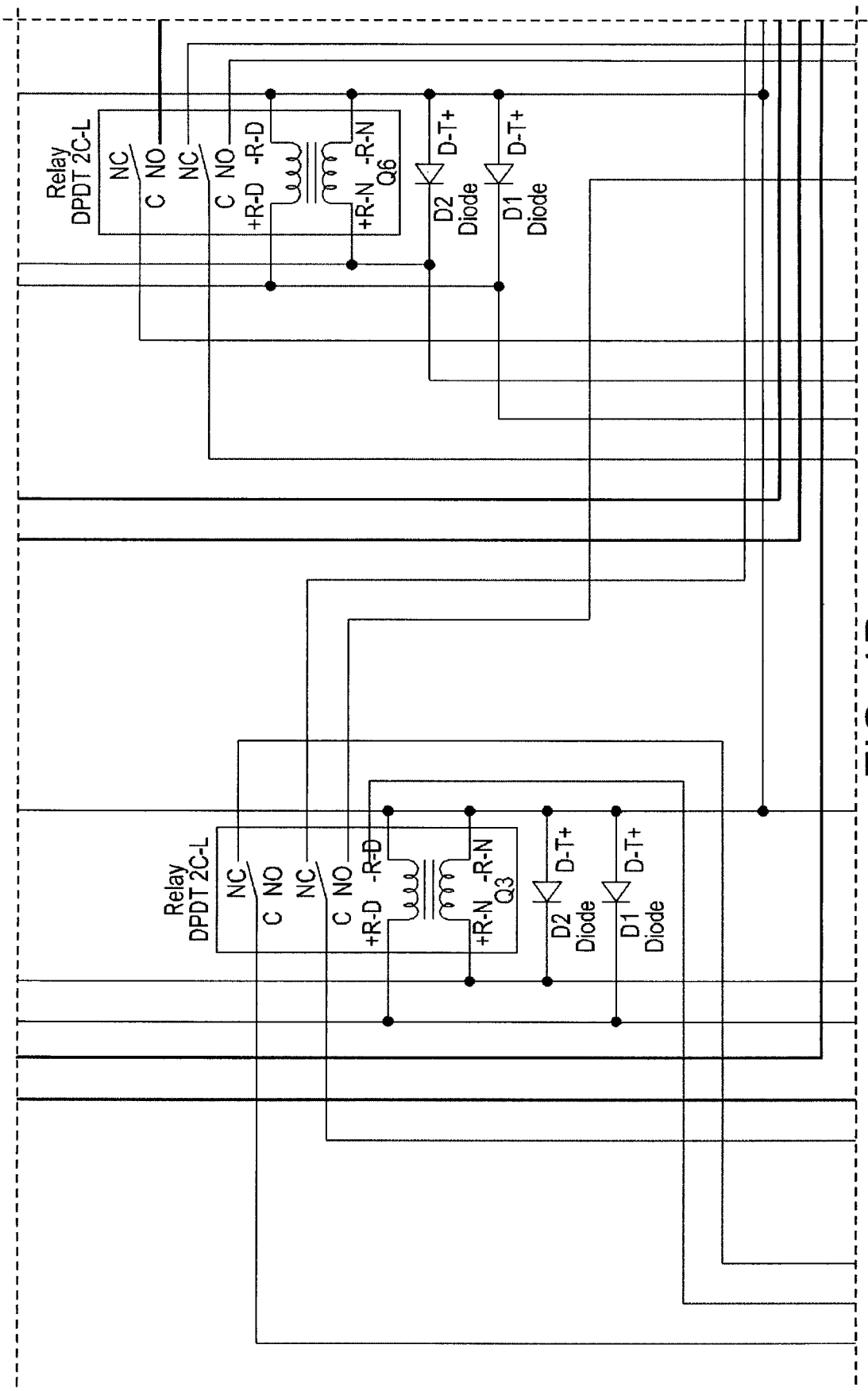
Figure 1E:
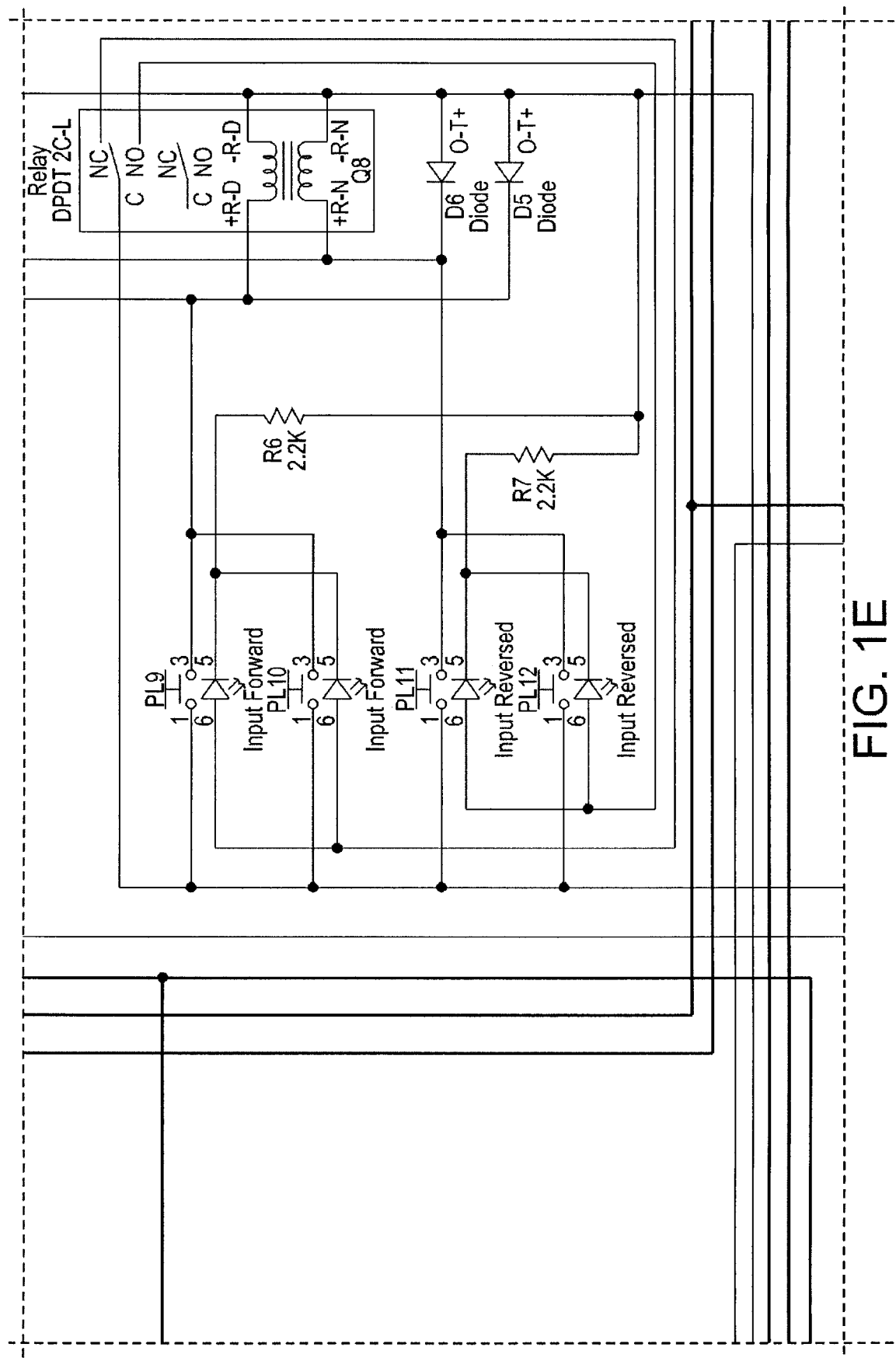

FIGS. 1A-1L depict the schematic electronic layout of the motherboard of one alternative of the migration tool, where signals (analog or discrete) from the field controlled or monitored device are inputted into the migration tool through a field-device connector (105) (See FIG. 1A).

Figure 1F:
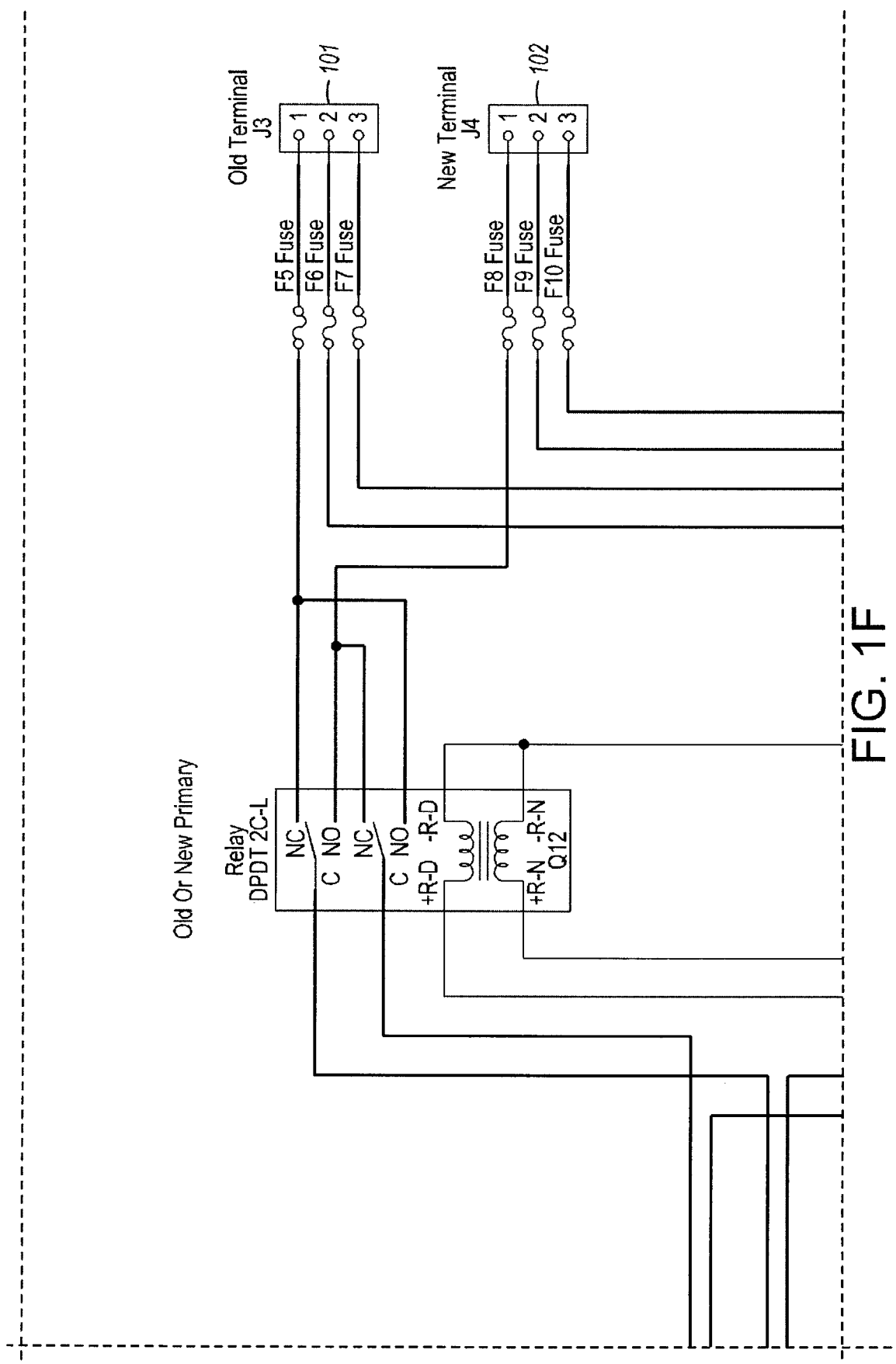
Figure 1G:
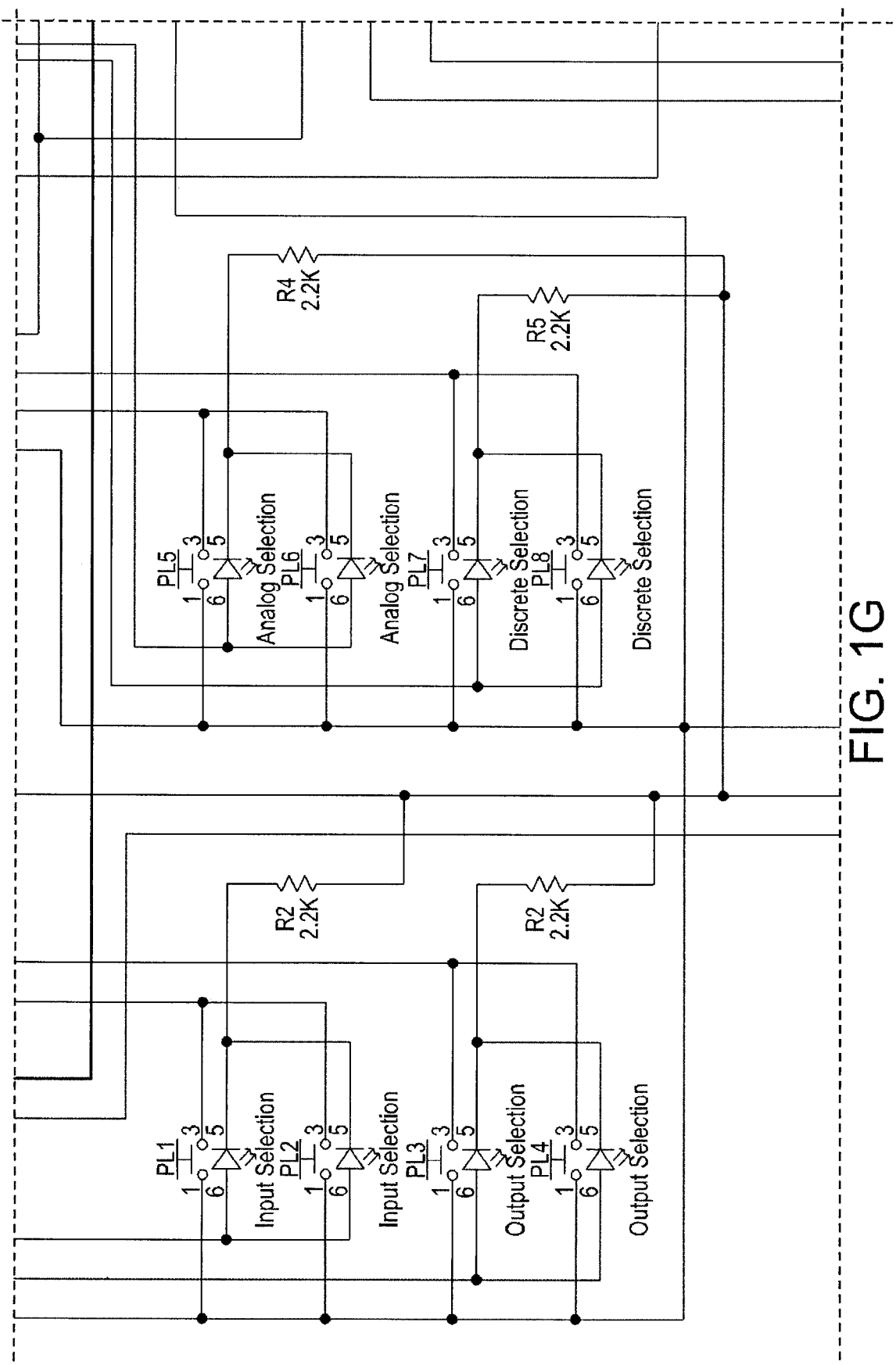
Figure 1H:
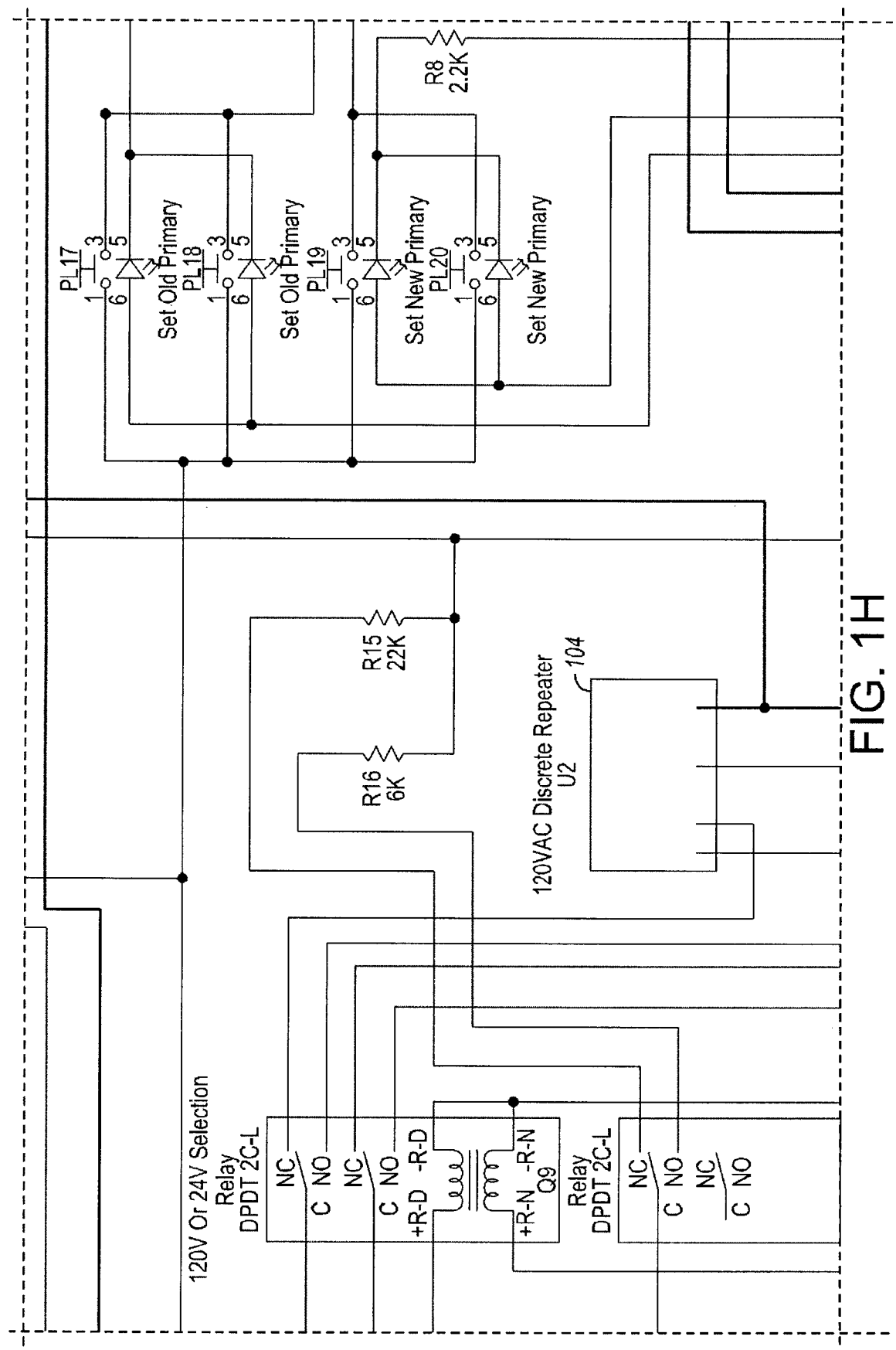
Figure 1I:
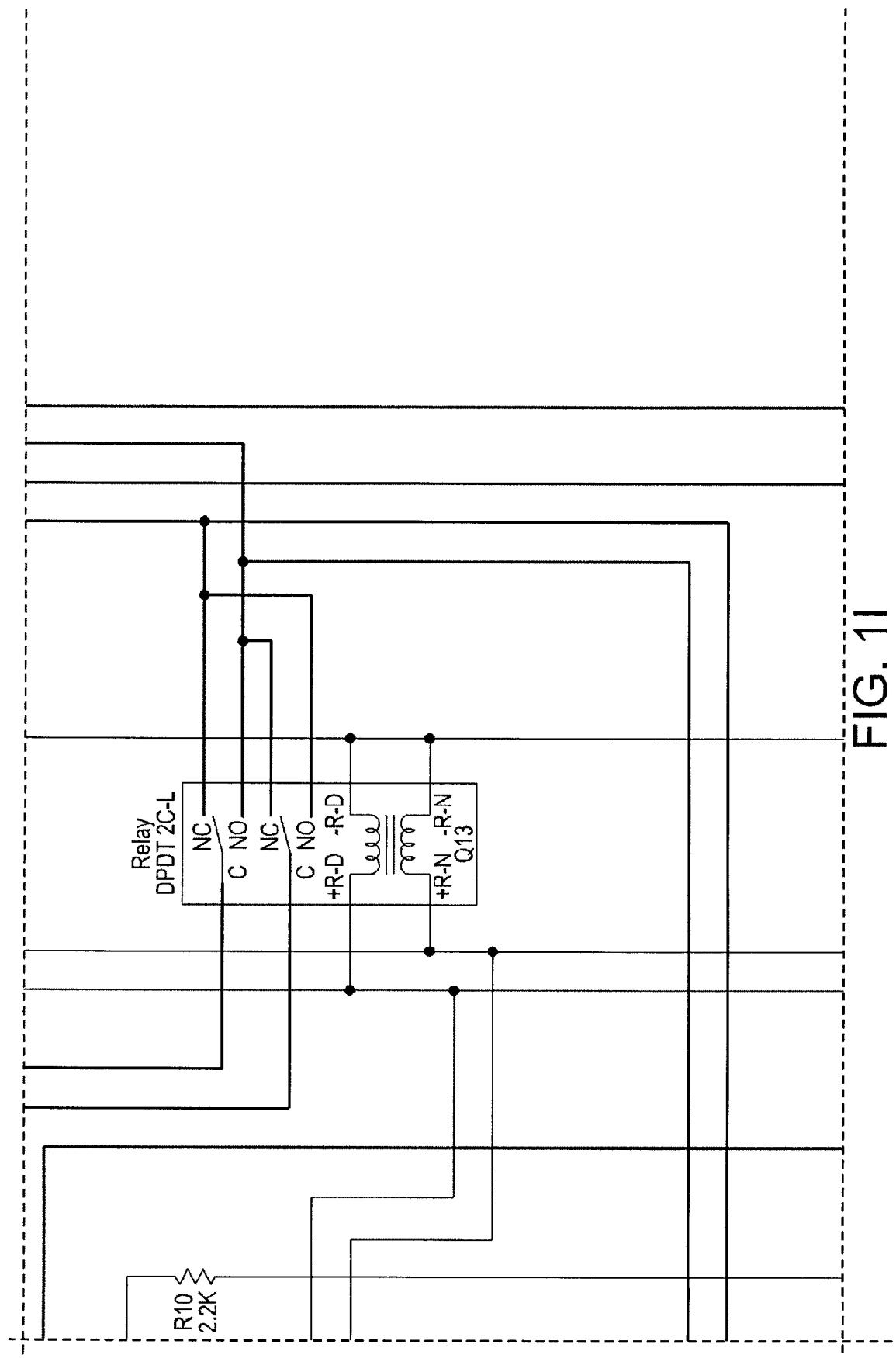
Figure 1J:
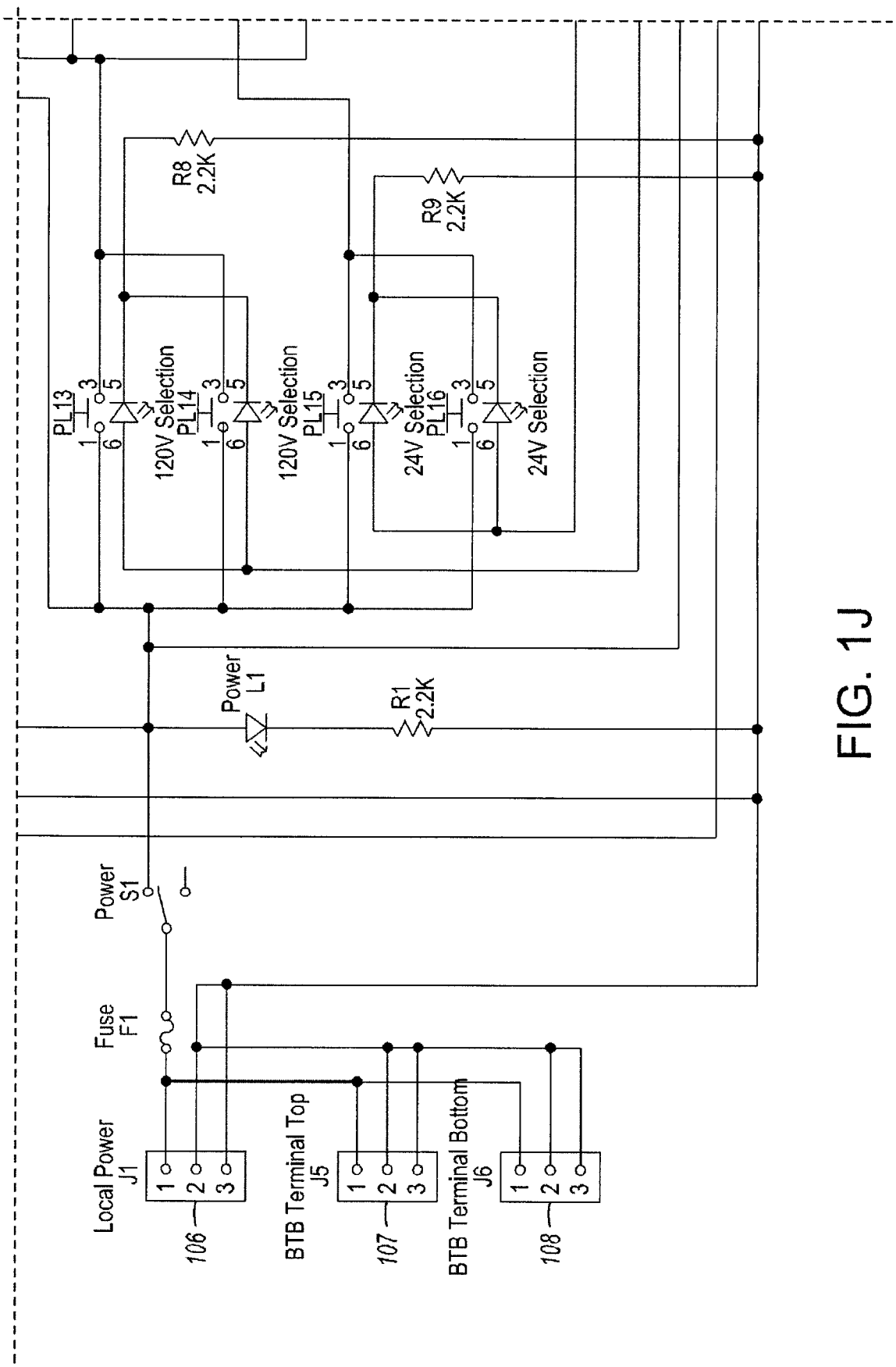
Figure 1K:
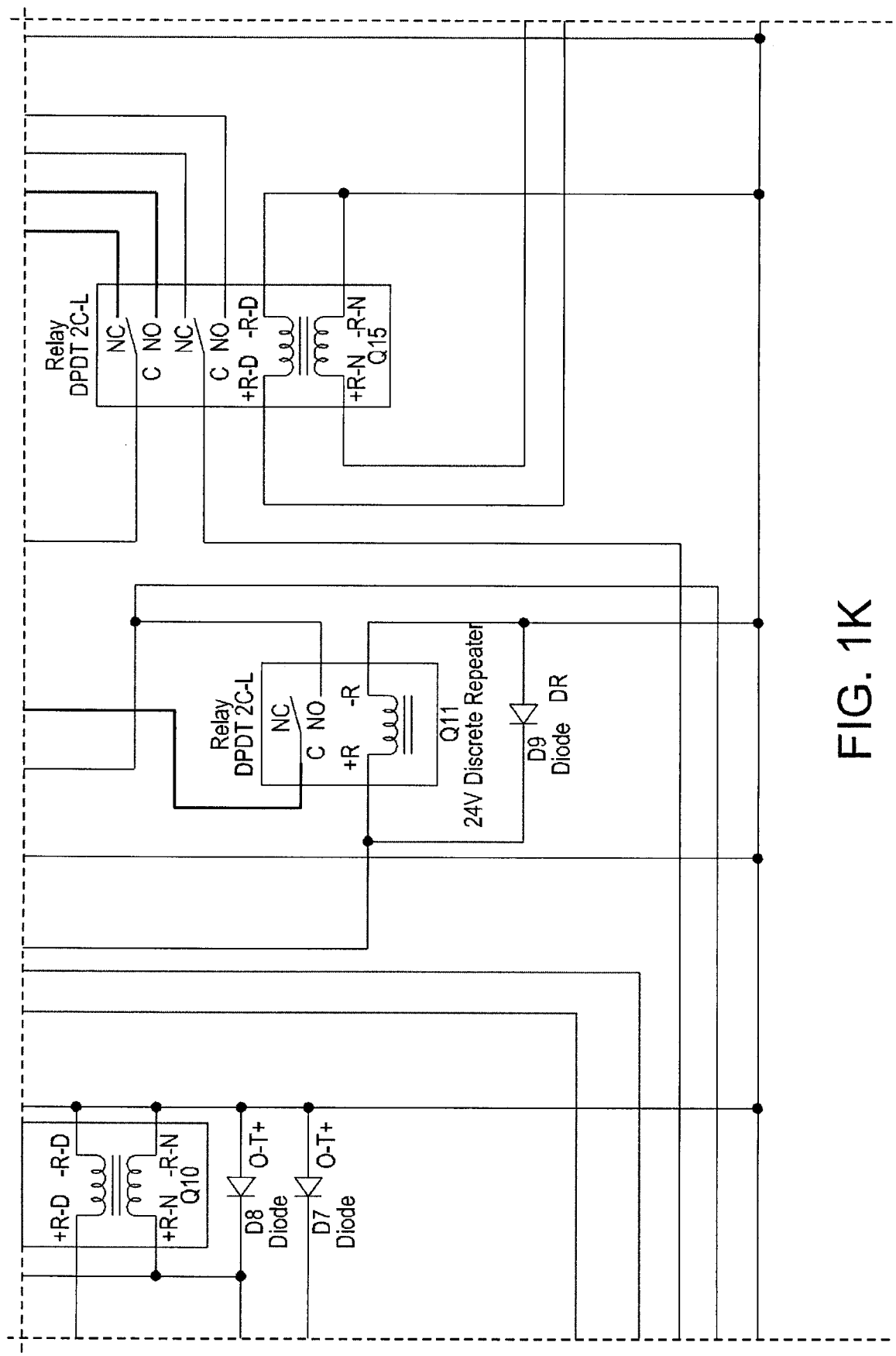
Figure 1L:
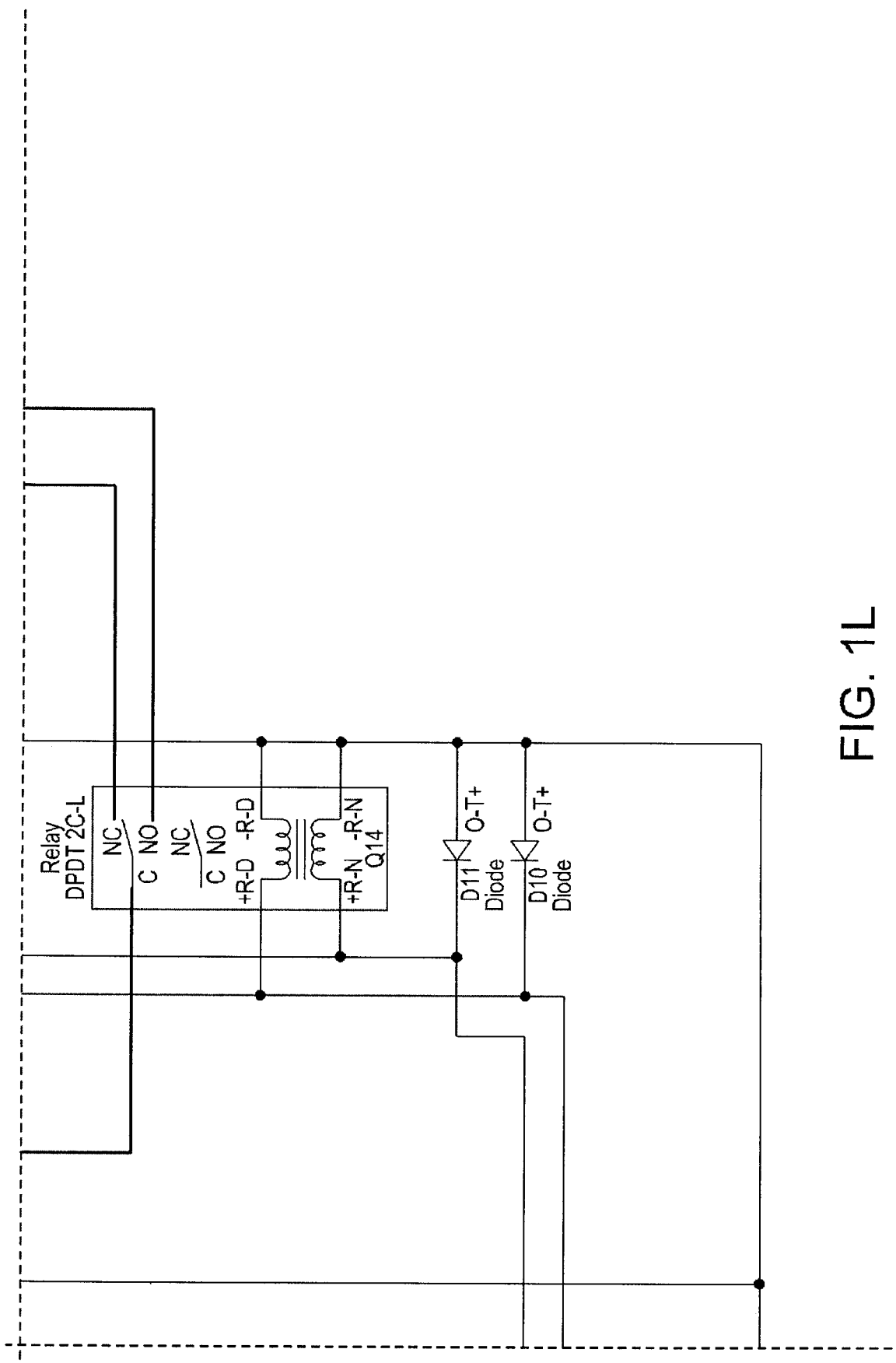

The migration tool also includes a connector for the old control system terminal (101) and a connector for the new control system terminal (102) (See FIG. 1F). Power can be supplied to the migration tool either through a local power supply input (106) (See FIG. 1J), which can be integrated into the migration tool itself or through a separate subsystem. Alternatively, power can be supplied to the migration tool through connectors, which may be located at different places on the migration tool, such as, without limitations, a connector at the top (107) at the Board to Board ("BTB") Terminal Top or a connector at the bottom (108) at the BIB Terminal Bottom of the migration tool (See FIG. 1J). As can be understood by a person skilled in the art, the use of such connectors allows having a plurality of migration tools connected together and allowing the plurality of connected migration tools to be connected to and feed off of a common power supply, preferably a remote power supply, white conveniently organizing power distributions from one migration tool to another in a stack of migration tools (see FIG. 2).

In this embodiment, an analog signal in the 4-20 mA range passes through a standalone signal repeater (103) (See FIG. 1C) that measures the current and sends the exact same signal to the secondary or new control system (102). In this embodiment, the signal repeater (103) is a two-wire current loop isolation conditioner operating in the 4-20 mA range. For any analog output, the signal repeater (103) acts as its own load for the secondary signal allowing the secondary or new control system (102) to sense an end device.

In various alternatives, the signal repeater (103) can be various analog signal repeaters, such as a repeater circuit comprising an operational amplifier. In addition, as can be understood by a person skilled in the art, it can be either directly integrated on the motherboard or can be an electronic chip mounted on the motherboard. Discrete signals, either from about 5 to about 30 V DC, typically 24V DC or 120V+/−20% AC mode, are passed through respective relays that allow the secondary signal path to mimic the state of the signals. This includes, in the above description, a solid-state relay (104) (See FIG. 1H). For any discrete output (from about 5 to about 30 V DC, typically 24V DC, 120V+/−20% AC), there are current dissipating resistors to act as a load so that the control system does not detect an open circuit.

Each migration tool may be fused for protection thus preventing damage to the migration tool or connected equipment. In this alternative, analog signal repeater (103) (See FIG. 1C) is sensitive to reverse polarity and in some wiring situations (4-wire versus 2-wire transmitters), the wiring is backwards. To allow for over voltage protection and proper signal duplication (replication), a series of rectifier circuits are added to the two signals (primary and secondary).

In the input mode, whereas the signal is sent from the field-device to the control terminal, the signal processed by the migration tool enters the migration tool at the field-device connector (105) and is outputted from the migration tool to a connector (101) connected to the old control system, until it is required to operate the swing-over. When required to swing-over the signal to the assigned marshalling cabinet or field junction box or new control system, the signal is then directed to the connector (102) connected to the assigned marshalling cabinet or field junction box or new control system. Once the new control system is running the plant, the migration tool is removed.

Figure 1M:
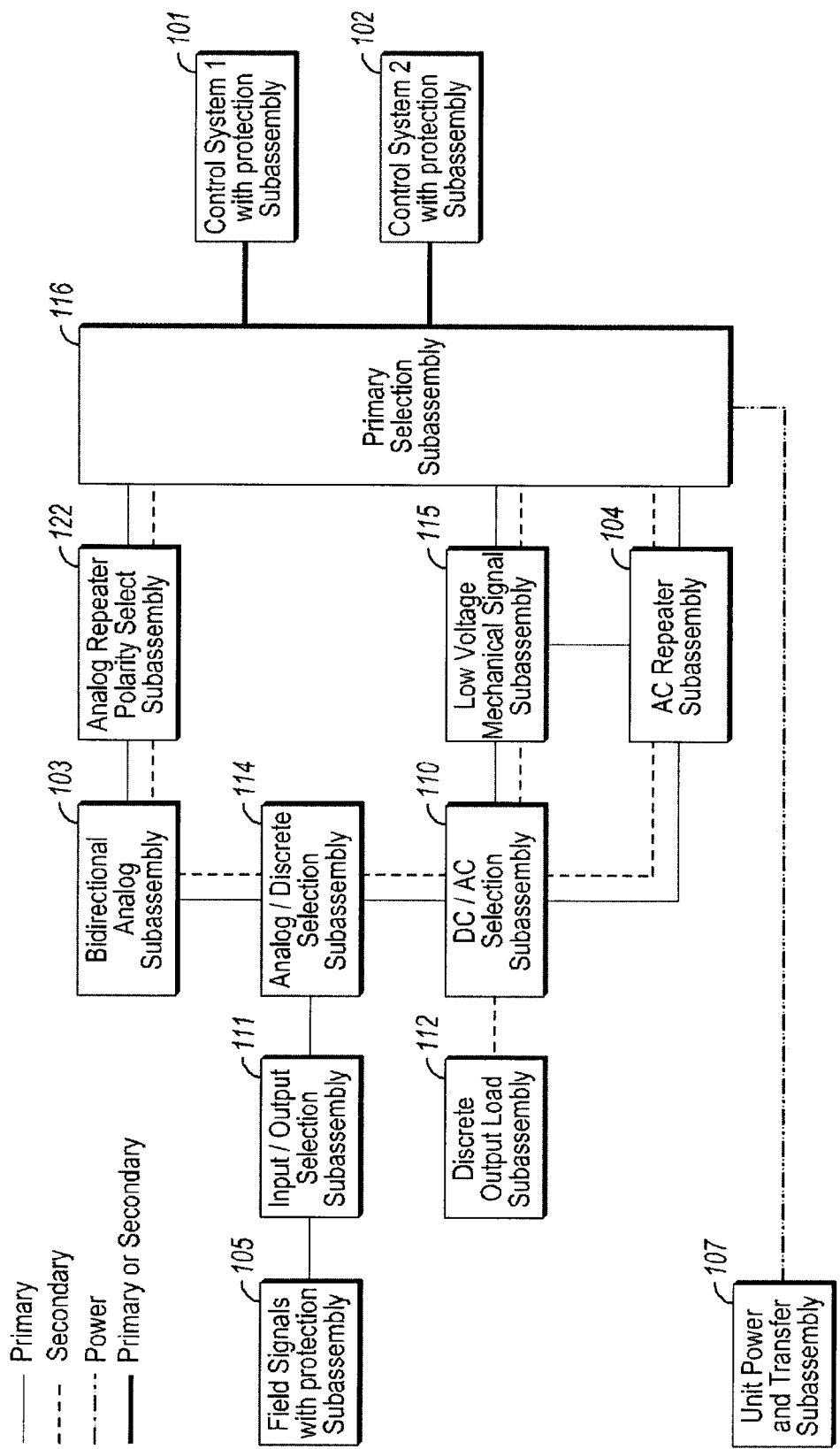
FIG. 1M is a functional block diagram of the migration tool schematic of FIGS. 1A-1L.

FIG. 1M depicts the schematic of FIGS. 1A-1L in a functional block diagram with several functions further identified. In particular, FIG. 1M further depicts and describes an Input/Output Selection (111), Analog Discrete Selection (114), DC/AC Selection (110), Discrete Output Load (112), Low Voltage Mechanical Signal (115), Primary Selection (116) and Analog Repeater Polarity Selection (122).

For the purpose of the migration of control systems, at least one connector, preferably a cable, more preferably an interconnection cable, is used to tap onto the existing field wiring of the existing control system to bypass and copy the signals through the migration tool.

Figure 2:
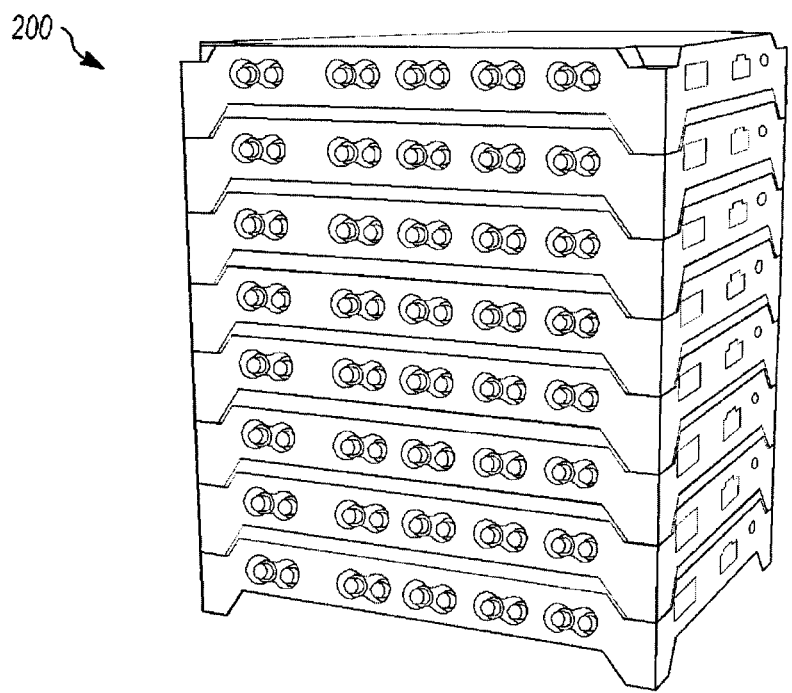
FIG. 2 is an illustration of several migration tools stacked on top of each other for the migration of a plurality of signals, in one alternative.

In another alternative, the migration tool is designed with a variety of external physical characteristics. The size and shape of the migration tool housing (also known as the form factor of the migration tool casing) is designed in a way that allows multiple migration tools to stack adjacent each other. In one alternative, this allows each device to power each other individually. The height of each migration tool has been designed to align with typical field marshalling terminals, which reduces the length of the interconnection cables and simplifies wiring. When stacked, the spacing between each migration tool allows for dissipation of heat arising from operation of the migration tool. The housing protects the migration tool from various environmental conditions typically found in control rooms, rack rooms, and motor control centers. The housing also protects the internal electronics from wear and external forces such as falling. The housing is, in this example, made of plastic, but can be made of other material, in one alternative, metal, or partly from metal and partly from plastic, in other examples. There is no limit to how many migration tools may be used at any time. A stack of migration tools may, in one example, go from the floor to the top of a marshalling cabinet or field junction box with adequate support installed. An example of a vertical stack (200) of migration tools is illustrated in FIG. 2. By using a suitable support assembly/frame, a person skilled in the art may arrange the array of migration tools in a vertical configuration, horizontal configuration or combinations thereof, aligned with the arrangement of field terminations of the control systems being migrated. Another example of how the migration tools may be arranged is to have a plurality of support racks with a migration tool therein and said support racks installed in parallel in one or more adjacent remote locations.

Each migration tool is used individually for a single loop, but multiple migration tools are used at the same time for many loops comprising an operating system. When all signals for a system are connected through the migration tools, both control systems see all the same real-time information. With the same inputs, the outputs for both control systems should match based on the programmed logic. This allows for real function testing and commissioning of the new control system while the old control system is actively controlling the required outputs. Once the commissioning of the logic is complete, the swing-over of the primary system (the one actually controlling the outputs) can begin one loop at a time until all loops are swung-over. Then the new control system wires can be terminated and the migration tools will be removed leaving a clean and organized wiring scheme for that operational system. All this can be accomplished without shutting down any equipment in a plant or shutting down the plant itself.

The analog and discrete replication and simulation circuitry is reverse polarity protected to not only prevent damage to equipment, but to also allow the signal to flow in the correct direction and polarity.

The electrical functionality of the migration tool is a hardware only based system using solid state and mechanical electronics to provide a variety of functions in different modes. For this specific example, the migration tools functionality may be separated into eight subassemblies: Tool power; primary/secondary swing-over; mode selection; analog signal replication; analog end device simulation; discrete signal replication; discrete end device simulation; interconnection cables; which combined compose the online migration tool enabling modernization of control systems without plant shutdowns.

In one alternative, the electrical parts of the migration tool require from about 5 to about 30 V DC, typically 24V DC power. This may be provided by an external power source or battery module. Each migration tool contains power connections to transfer power to boards stacked on top or below said migration tool. This simplifies the wiring when using multiple migration tools. Wired jumpers may also be externally connected to the power terminals for added redundancy. In the event of a power failure to the migration tool, the mode selection does not change therefore any primary signals being used for control will not be disrupted. Should there be a power failure to the migration tool, the primary signal is maintained via a primary signal maintaining feature of the migration tool. In one alternative, this is achieved with a latching relay as described herein, or obvious equivalent.

The migration tool described herein may swing-over control of the I/O signals to a new control system without any break in the I/O wiring path. This is accomplished through bypassing the signals through the migration tool with the interconnection cables. Both the existing control cables connected to the old control system plus the new control cables connected to the new control system are wired to the migration tool. Once the migration tool operator is ready, in one alternative, a dual pushbutton action is required to swing-over the control mode and physical signal path from the old control system to the new control system. The purpose of having a dual pushbutton action is to prevent accidental changes from the migration tool operator or anyone else in the area. The selected system (old or new) is indicated back to the operator via a positive feedback. LED light in the pushbutton.

For any analog or discrete inputs or outputs, a buffer circuit can be turned on when selecting the mode. Preferably, this buffer circuit will hold the current value for a slightly longer time than it takes to change the primary system. In one alternative, the current value hold time is from about 0 to about 20 milliseconds. In one example, the current value is held for about 2 milliseconds.

The migration tool is a multifunction unit that is capable of handling all conventional I/O signals typically used in control systems. To set up each migration tool to match the type of signal, the following modes need to be selected before the unit is used. The modes are set via a mode selector. In one alternative the mode selector is at least one pushbutton, preferably a plurality of pushbuttons. In one alternative, the pushbuttons are situated on the migration tool. In one alternative, a dual pushbutton action is required to change a mode. The purpose of having a dual pushbutton action is to prevent accidental changes from the migration tool operator or anyone else in the area. The selected mode is indicated back to the operator via a positive feedback LED light in the pushbutton. The following modes can be selected: Input or Output; Analog or Discrete; 120V+/−20% AC or from about 5 to about 30 V DC, typically 24V DC; Buffer Off or Buffer On (See FIGS. 4A-4C).

When analog mode and input mode are selected, the primary analog signal will be measured and replicated to the secondary control system wiring. This allows for any control logic in either the new or old control system to be calculating a reaction based on real process values. Simple or complex control loops will see the same information on both control systems. Therefore the reaction for the output or outputs will be the same from either system.

When analog mode and output mode are selected, the primary analog signal will be controlling the field device and the secondary signal will go to the migration tool and the migration tool will mimic an end device to prevent an open loop detection alarm. This allows the secondary system to think it is controlling the output allowing the configured logic to compute properly. When the discrete mode and the input mode are selected, the primary discrete signal will be measured (on/oil) and replicated to the secondary control system wiring. This allows for any control logic in either the new or old control system to be calculating a reaction based on real process values. Simple or complex control loops will see the same information on both control systems therefore the reaction for the output or outputs will be the same from either system.

When the discrete mode and the output mode are selected, the primary analog signal will be controlling the field device and the secondary signal will go to the migration tool and the migration tool will mimic an end device resistance to prevent an open loop detection alarm. This allows the secondary system to think it is controlling the output allowing the configured logic to compute properly.

Figure 1N:
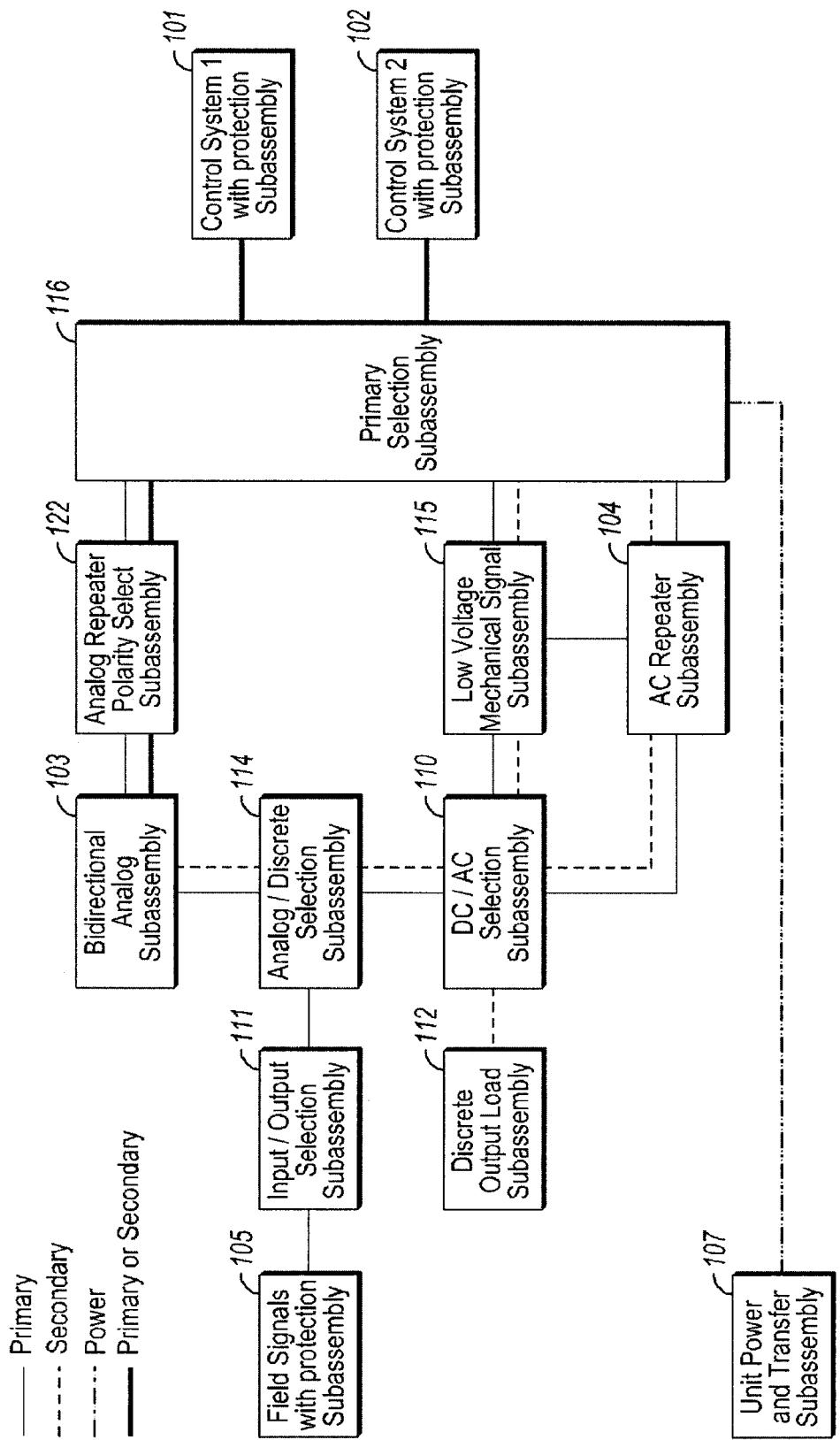
FIG. 1N is a functional block diagram of the migration tool schematic of FIGS. 1A-1L functioning in an analog input mode.

FIG. 1N depicts the functional block diagram of the migration tool of FIG. 1M when in an analog input mode example. This represents the most common analog field device configuration with from about 5 to about 30 V DC, typically 24 V DC power for the field device provided from the Primary Control System (in this example Control System 1).

The primary 4-20 mA signal generated from the field device is introduced to the migration tool through subassembly (105), then the Input/Output subassembly (111) which in this instance is configured for an Input routes the signal to the Analog/Discrete subassembly (114) which has been set to analog, thus routing the signal to the bidirectional analog subassembly (103) so the signal can be replicated and then transmitted on to the primary and secondary control systems after further subassembly processing. The analog repeater polarity subassembly (122) is set to ensure the polarity of the field device and control systems are correct for the terminal polarity of the associated control system analog input card. The Primary Selection subassembly (116) is the only subassembly that changes state during the migration process, however in the configuration shown it is set with the Primary Control system as Control System 1 via Control System 1 subassembly (101).

The replicated signal generated from the bidirectional analog subassembly (103) passes through the analog repeater polarity select subassembly (122) and primary selection subassembly (116) to the control system 2 subassembly (102) and via the interconnecting cable to Control System 2.

Interconnection cables are used to connect the marshalling cabinet or field junction box wires to the migration tool to bypass the signal through the migration tool. Each of the interconnection cables have pierce probes on the end to tap into each of the marshalling cabinet or field junction box wires while the signal path is still connected to the marshalling terminals. Three cables can be used for each loop: one for the field side wires, one for the old control system wires, and one for the new control system wires.

Figure 3A:
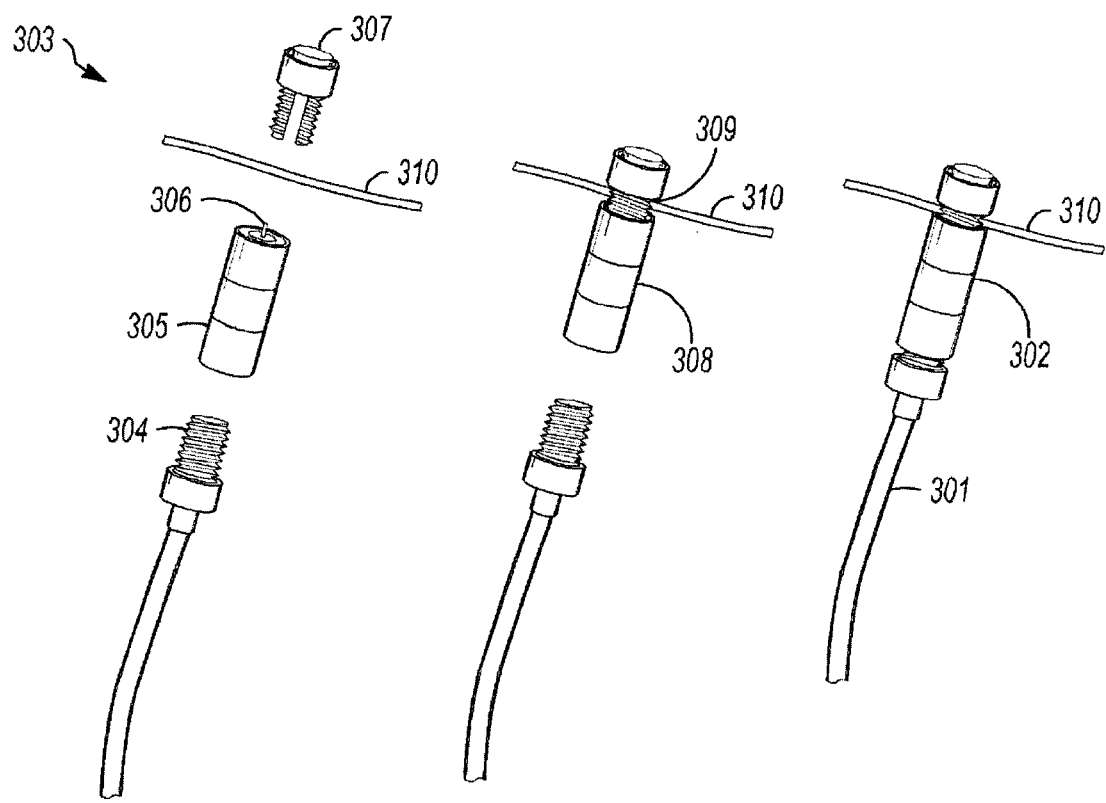
FIGS. 3A-3F is an illustration of a cable for tapping into wiring useable in accordance as in FIG. 1.

FIG. 3A illustrates a custom interconnection cable extremity, for tapping onto the existing wiring (310) and gaining continuity with the signals without disturbing or rewiring the signals. Such custom cables are made of the terminal that connects to the migration tool (not illustrated, which may be a standard connector), the cable body itself (301), and the pierce probes (302) that tap onto each signal wire. The probes (302) are then made up of several parts, illustrated in an exploded view (303): the threaded end (304) that is connected to the cable body (301) allowing said cable body (301) to spin freely; the pierce probe's body (305) with the needle (306) to gain continuity; and the threaded wire clamp (307) to hold the wire against the needle attached to the body. Typically, during assembly, upper portions (308) of the probes are assembled first on the wiring (310), leaving only a small gap (309) between the top of the threaded wire clamp and the pierce probe's body, for the tapped wiring (310) to go through. The threaded end (304) which is connected to the cable body (301) and allows the cable body (301) to spin freely inside thereof, may be assembled in a second step by attaching this threaded end (304) to the upper portion (308) of the probe.

Figure 3B:
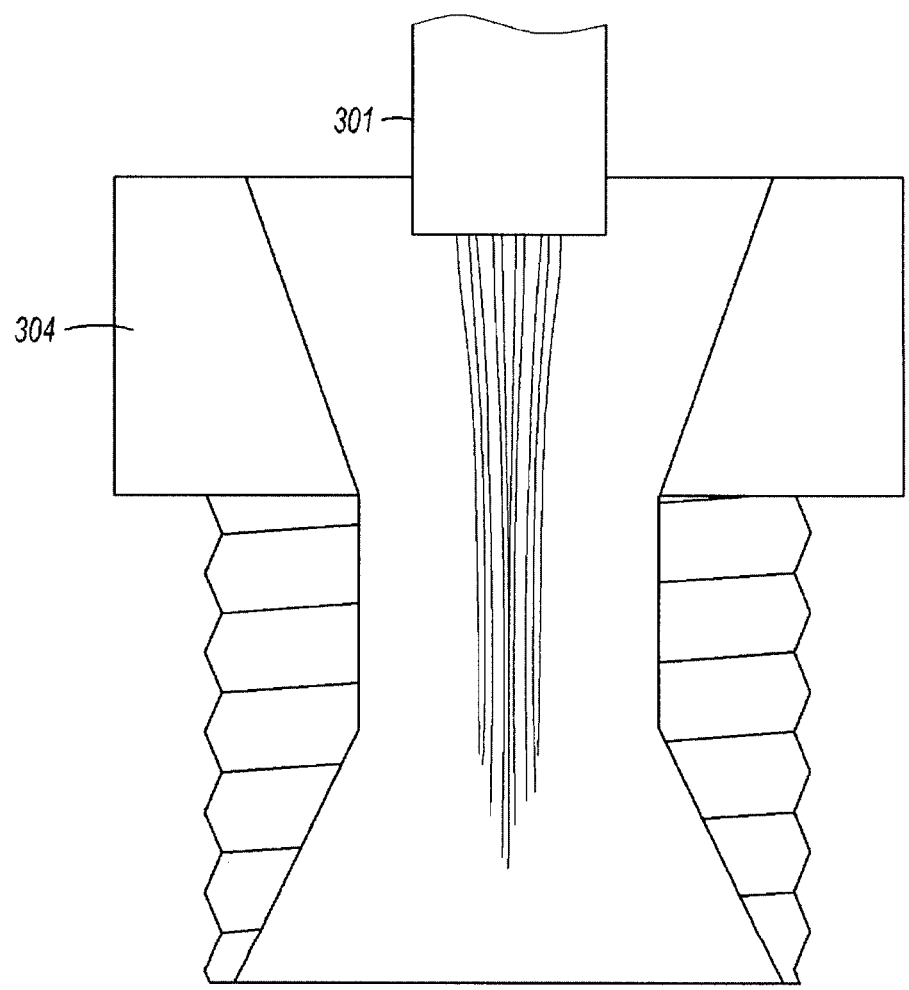
Figure 3C:
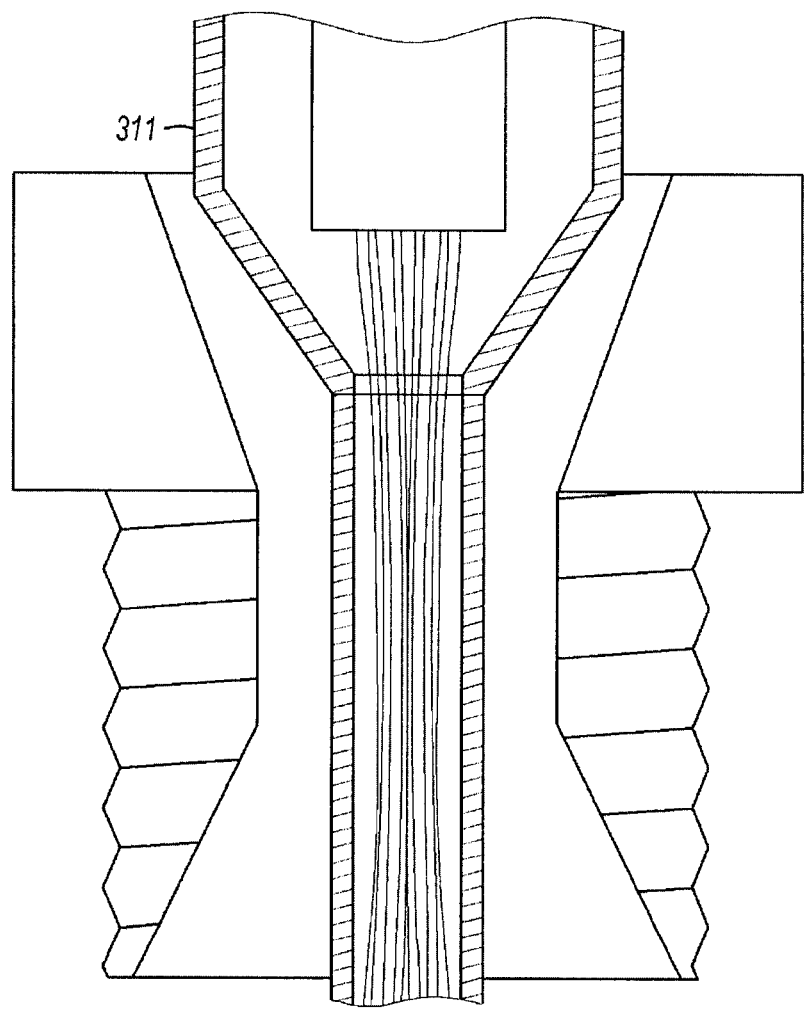
Figure 3D:
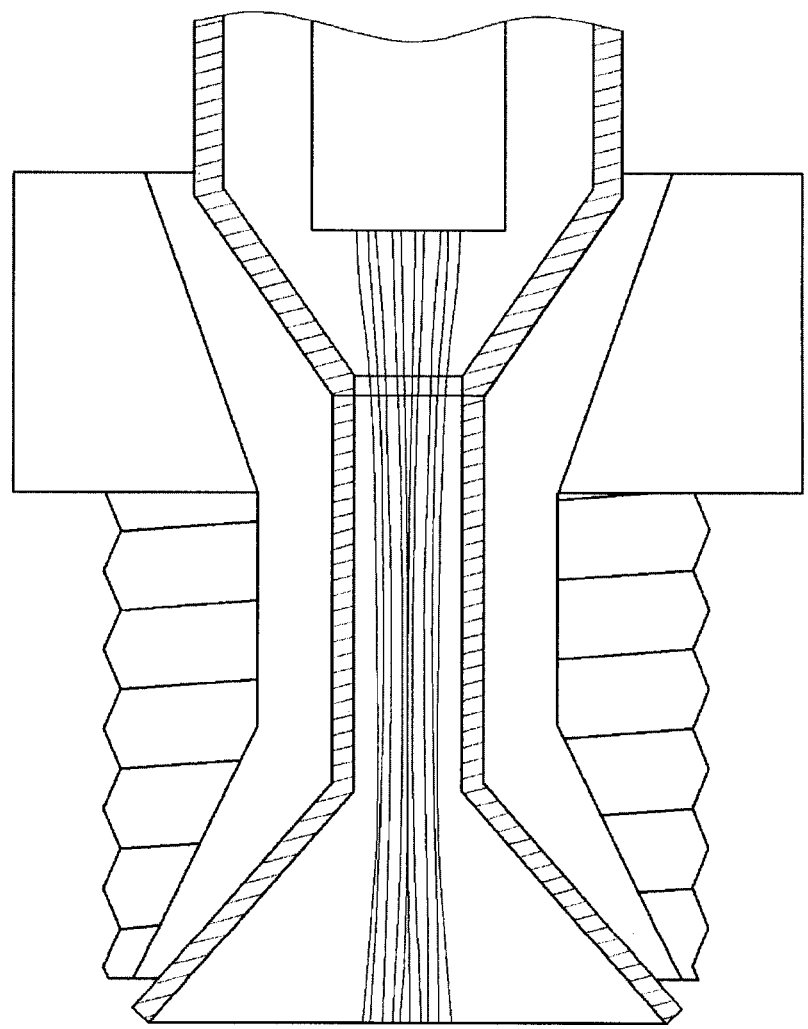
Figure 3E:
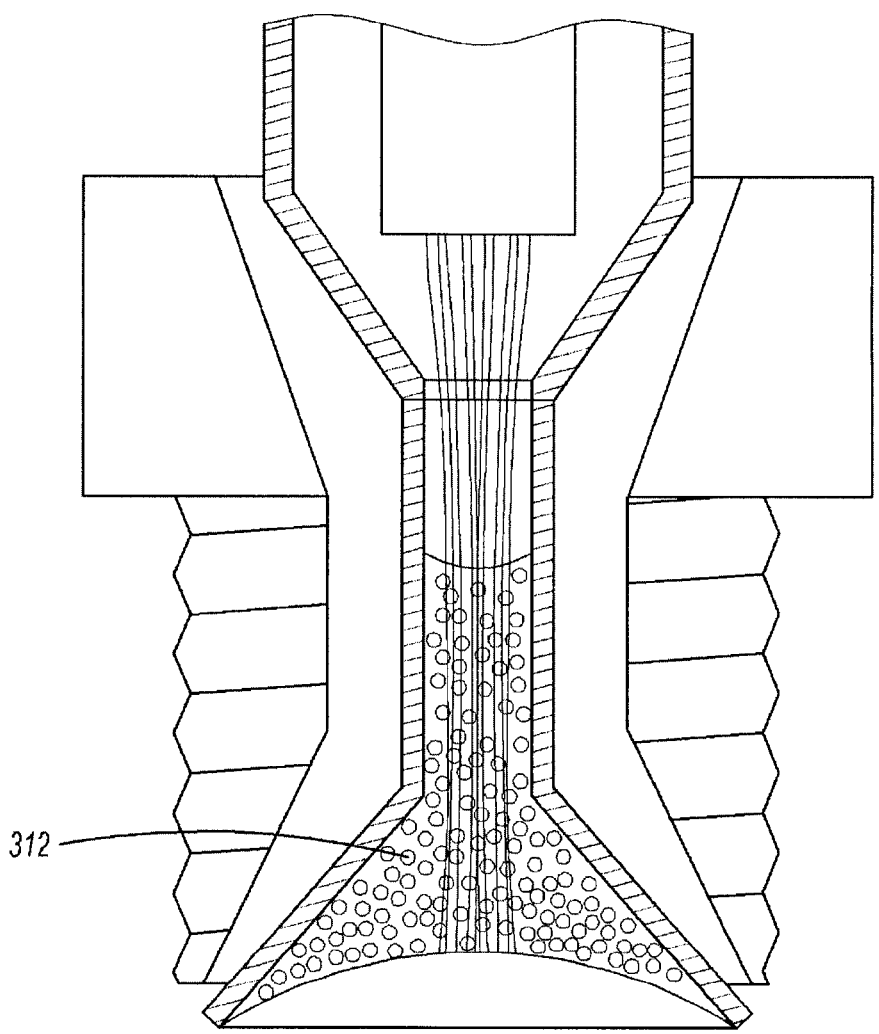

FIG. 3B depicts the typical prior art assembly wherein the cable body (301) is inserted in a threaded end (304) and the wire from the cable body (301) is threaded to the body (302) such that the wire from the cable body (301) makes contact with the inner needle and the wire may be damaged from the connection such that to reconnect the cable body (301), the cable would need to be stripped and new wire would need to be exposed for optimum contact.

FIGS. 3C-3F depict the present connection assembly.

Figure 3F:
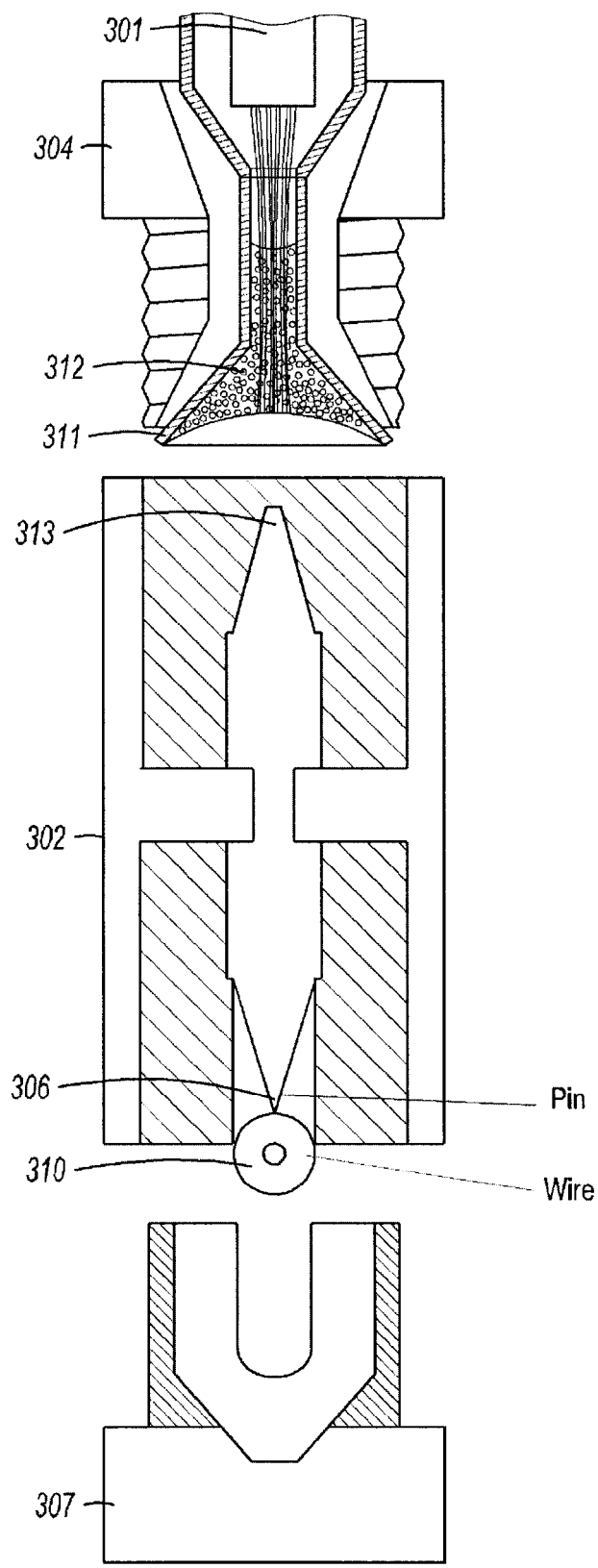

In this alternative, the cable body (301) is inserted in to a tube, preferably a ferrule (311) having an insulated end and a non-insulated end, which is then inserted into the threaded end (304). The non-insulated end of ferrule (311) extends just beyond the other end of the threaded end (304). The non-insulated end of ferrule (311) is conductive and typically made of metal. The non-insulated end of ferrule (311) is expanded (See FIG. 3D) to allow for an opening wider than the opening of the threaded end. This maintains the ferrule (311) in the threaded end (304) and allows the ferrule (311) to spin freely along the inner longitudinal axis of the threaded end (304). The wires at the expanded non-insulated end of ferrule (311) are then connected, preferably soldered, to the expanded non-insulated end of ferrule (311) while still allowing ferrule (311) to spin (or rotate) freely along the inner longitudinal axis of the threaded end (304). Referring now to FIG. 3F, an exploded view of the interconnection cable is depicted showing how the threaded end (304) with ferrule (311) and soldered contact surface (312) will contact inner probe conductor (313) which is in turn connected to needle (306) which in turn is connected to wire (310) and wire clamp (307). The aspect of the cable body (301) being able to rotate freely within the threaded end (304), also allows reuse of the cable body (301) without having to alter the cable body (301) in any form, the ability for the ferrule (311) to spin freely also ensures the cable body (301) itself will not be stressed or twisted during any connection, as any twisting, should it untwist, can result in a loosening of the connection and hence result in potential loss of electrical continuity of the signal.

The expanded end of ferrule (311) prevents the cable body (304) from slipping out of threaded end (304) thus ensuring a reliable connection and signal continuity between the pierce probe, pierce probe body and signal cable.

Figure 4A:
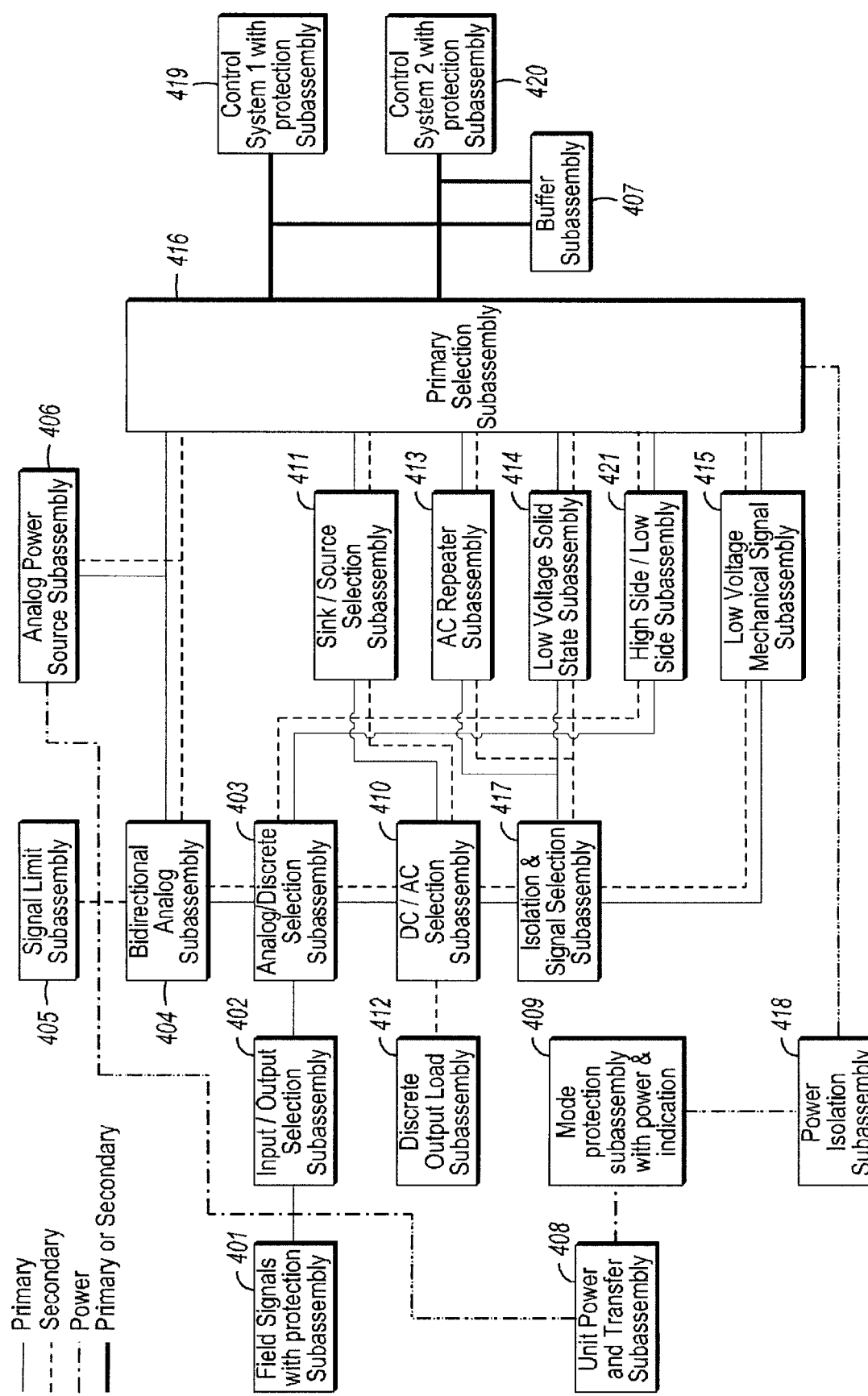
FIG. 4A is a functional block diagram of the subassemblies of the migration tool according to another alternative.

Referring now to FIG. 4A, in this alternative, the migration tool comprises twenty-one subassemblies. All fuses incorporated in this embodiment of the migration tool are replaceable by an operator trained and proficient in the arts. Furthermore, this alternative may be configured in a variety of different configurations or modes as a function of the selection made using appropriate switches in each subassembly, such as latching LED feedback push button relays and/or DIP switches to provide the following functions:

Input or output signal selection (subassembly 402)
Analog (continuous) or discrete (on/off) signal selection (subassembly 403)
Signal Limit (subassembly 405)
Analog Power Source (subassembly 406)
Discrete Signal sink or source signal (subassembly 411)
Buffer on or off during transition between control systems selection (subassembly 407)
from about 5 to about 30 V DC, typically 24 Volts DC or 120 Vol+/−20% AC selection (subassembly 410)
Isolation and Signal selection (subassembly 417)
Primary control system selection (subassembly 416) to choose which control system is being used for control versus operating with replicated signals.

The migration tool configuration is predetermined to a combination of the above modes to provide a specific service prior to connection to the field device and control systems via subassemblies (401, 419, 420). Once installed in service, the only mode changes made are to migrate the signals between the two control systems at subassemblies 419 and 420 using the Primary Subassembly (416).

Signals from the field controlled or monitored device are inputted to the migration tool through a field device connector with associated fused power protection (subassembly 401). The Field Signal subassembly (401) is connected to the Input/Output (I/O) selection subassembly (402) which enables the selection of the Field Signal as either an input signal (from the field to the control system) or output signal (control system to field) including isolation with push button latching relays and LED feedback. Selection of signal type of Analog or Discrete is made with the subassembly (403) of isolating relays and LED feedback push button relays.

Based on the configuration of analog/discrete selection subassembly (403) the signal will be directed to either the Bidirectional Analog subassembly (404), or the DC/AC selection subassembly (410).

In this embodiment, an analog signal in the 4-20 mA range passes through a two-wire current loop isolation conditioner and standalone signal repeater operating in the 4-20 mA range that measures the current for eventual transmittal of the exact same replicated signal to the secondary control system (420) or control system 2. For any analog output, the bidirectional analog subassembly (404) acts as its own load for the secondary signal allowing the secondary control system (420) to sense an end device. The bidirectional analog subassembly (404) includes protective fuses and when necessary to fine tune the replicated signal to match the primary source signal the ability to calibrate the replicated signal. Depending on the type of signal being replicated two additional subassemblies; Signal Limit subassembly (405) and Analog Power Source subassembly (406) may further modify the signal before connecting with the Primary Selection subassembly (416).

To protect the migration tool circuitry as well as the devices connected to the migration tool, analog output signals, selected using LED feedback push button relays to activate the bidirectional analog subassembly (404) when required, are monitored by the Analog Signal limit subassembly (405).

Analog signals are normally connected as 2-wire devices with power provided from the control system, however an alternate 4-wire configuration where the device is powered in the field is also found, The Analog Power source subassembly (406) provides the migration tool the capability to support both types of signals using an appropriate switch, such as LED feedback push button relays to activate the analog power source subassembly (406).

Through the Primary Selection subassembly (416), the migration tool supports changing between making either control system connected to the associated control system subassemblies (419, 420) the primary or secondary control system. LED feedback push button relays enable reversible selection between which control system will be used to control the actual process and which control system will terminate in the migration tool's mimic circuitry in the appropriate subassemblies. The Primary Selection subassembly (416) is arranged as a 'break before make' configuration to avoid the potential for mixing signals, short circuits, arcs, or similar faults between the two control systems.

Signals between the migration tool and control system 1 (or old control system) not shown are connected to the migration tool through a field device connector with associated fused power protection via the Control System 1 subassembly (419). Similarly, Control System 2 subassembly (420) is used to connect the migration tool through a fused field device connector to control system 2 (not shown).

To provide bumpless/uninterrupted transfer of the signal between control system 1 and control system 2, the migration tool operator has the option to incorporate the Buffer Subassembly (407) between the Primary Selection Subassembly (416) and the two Control System Subassemblies (419, 420). The Buffer Subassembly (416) when activated, in one alternative by LED feedback push button relays, will hold the current value for a slightly longer time than it takes to change the primary system. In one example, the value is held for about 4 milliseconds.

Discrete signals are either direct current (DC) or alternating current (AC) and the migration tool's DC/AC subassembly (410) uses appropriate switches, in the alternative LED feedback push button relays and associated relay circuitry, to direct the signal type to the correct signal processing subassemblies (411, 412, 417) of the migration tool.

The output mimic resistance circuitry for the secondary control system output is contained in the Discrete Output Load Subassembly (412) where the current dissipating resistors act as a load so that the control system does not detect an open circuit.

Discrete signals can be configured to be either sinking (grounded connection to the load) or sourcing (provides a voltage source to the load) with the Sink/Source Selection Subassembly (411) configuring the migration tool to connect the appropriate lead to ground.

120 V+/−20% AC discrete signals are measured and replicated in the AC Repeater Subassembly (413) and directed via the Primary Selection Subassembly (416) to the two Control System protection Subassemblies. (419, 420).

Depending on the level of required sensitivity, discrete signals may be configured to measure as either High or Low side sensing. The migration tool High Side/Low Side Subassembly (421) automatically senses and identifies which configuration is applicable based on the control system to which it is connected and then selects the proper configuration to interface to the control system through the Buffer Selection (407 and control system protection assemblies (419, 420).

Very rapid (i.e. pulse mode up to 7000 Hz) as well as low voltage signals require solid-state circuitry to isolate and replicate the signal without alteration. This function is performed by the Low Voltage Solid State Subassembly (414) with the solid-state circuit preferably protected by a fuse.

Low voltage signals with a lower frequency rate are routed by the Isolation Signal Selection subassembly (417) to the Low Voltage Mechanical Signal Subassembly (415) relay and diode to replicate this form of discrete signal to the secondary control system.

The Isolation and Signal Selection Subassembly (417) isolates and selects the appropriate routing for each discrete signal type; 120 V+/−20% AC, low voltage rapid, or mechanical signal repeater and forwards the signal to the appropriate subassembly (413, 414, 415) for further processing.

The Unit Power and Transfer Subassembly (408) provides the fused external connections to provide from about 5 to about 30 V DC, typically 24 Volts DC power to the migration tool(s). Power can be supplied to the migration tool through connectors, which may be located at different places on the migration tool, such as a connector at the top, or a connector at the bottom or a dedicated connector on the side of the migration tool. As can be understood by a person skilled in the art, the use of such top and bottom connectors allows having a plurality of migration tools connected together to a common remote power supply, while conveniently organizing power distributions from one migration tool to another in a stack of migration tools.

The migration tool on/off switch and additional fuse protection are incorporated in the Mode Protection Subassembly (409), in this alternative with a local LED indication, to verify the migration tool is receiving sufficient power to energize all required functionality.

Supply of a secondary signal power source is provided to the secondary control system through the Primary Selection Subassembly (416) by the Power Isolation. Subassembly (418), in this alternative selected with LED feedback push button relays.

The Power Isolation Subassembly (418), when enabled, allows the migration tool to supply power to the secondary signal to a sinked signal type of any supported voltage. Enabling this mode allows the isolation of the migration tool's supply power terminal for this purpose and redirects the migration tool's power requirements to the top and bottom power connectors.

Signals to or from the existing control system are connected to the migration tool through a field device connector with associated fused power protection (Subassembly 419) while the similar functionality for the new control system is provided by an identical connector and protection Subassembly (420).

All LED push button changes are confirmed through activation of the LED in the selected option of the 2-choices at each of the selection/configuration ports. Any migration tool configuration changes made through the operator interface require a dual push button action to prevent accidental changes from the migration tool. Furthermore, all push buttons are installed flush with the migration tool enclosure to prevent accidental activation.

Figure 4B:
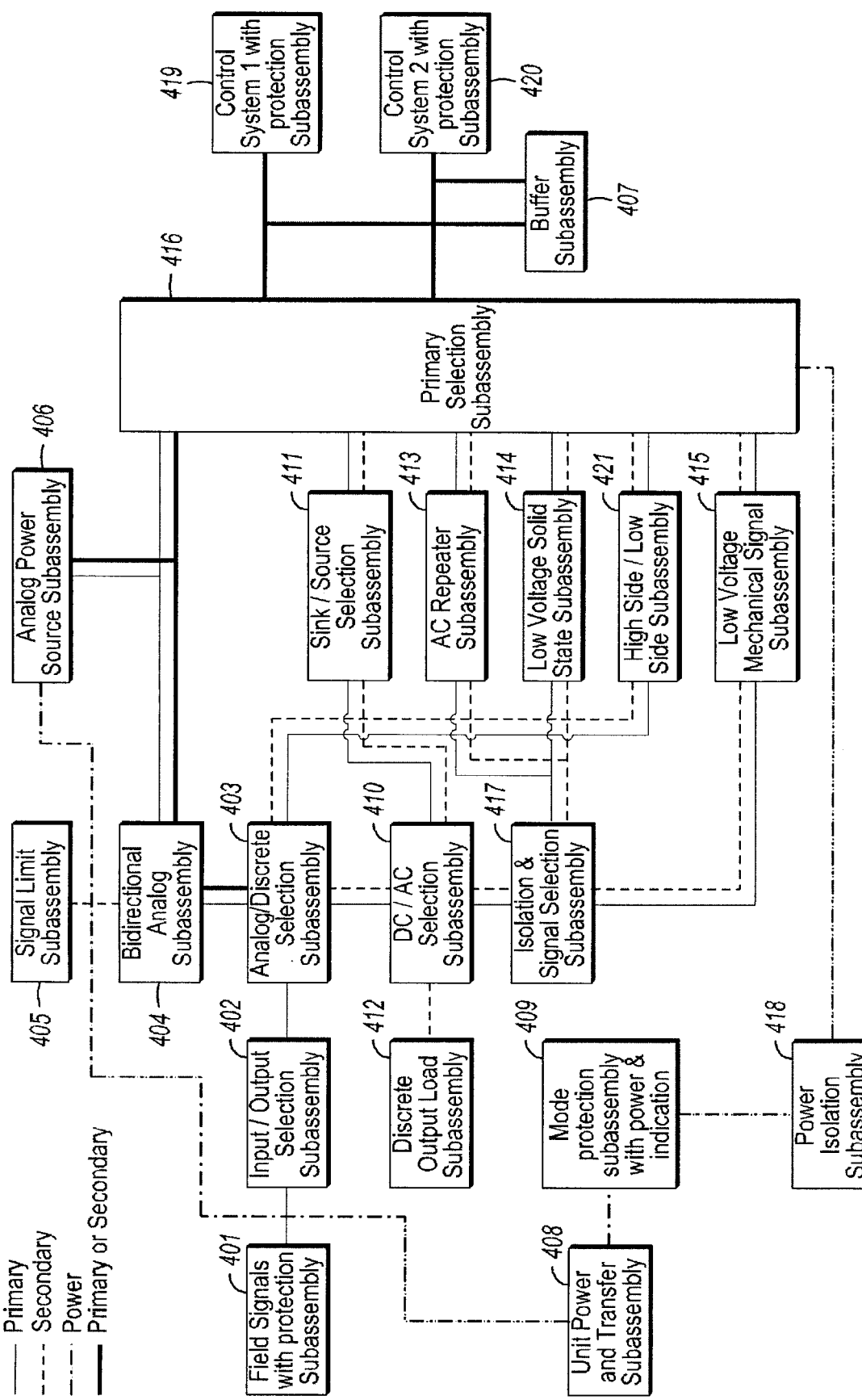
FIG. 4B is a functional block diagram of FIG. 4A showing the migration tool functioning in an analog input mode according to one alternative.

FIG. 4B represents the installation in which the analog field device has a separate power supply providing from about 5 to about 30 V DC, typically 24 VDC analog 4-20 mA signal.

The primary 4-20 mA signal generated from the field device is introduced to the migration tool through subassembly 401, then the Input/Output subassembly (402) which in this instance is configured for an Input routes the signal to the Analog/Discrete subassembly (403) which has been set to analog, thus routing the signal to the bidirectional analog subassembly (404) so the signal can be replicated and the transmitted on to the primary and secondary control systems after routing through the Primary Selection subassembly (416) set with the Primary Control system as Control System 1 via Control System 1 subassembly (419). The Buffer Assembly (407) may or may not be activated however in this instance it is shown as activated meaning that when the Primary Selection subassembly (416) which is a 'break before make' design to prevent possible short circuit, is activated the last value generated is held constant during this short transition period ensuring the control systems do not see any change or loss in the signal.

The replicated signal generated from the bidirectional analog subassembly (404) passes through the analog power source subassembly (406) so that the signal has from about 5 to about 30 V DC, typically 24 V DC power for the repeated signal and then to the primary selection subassembly (416) and then the control system 2 subassembly (420) and via the interconnecting cable to Control System 2. The Buffer Assembly (407) is connected to both control systems to manage the signal transition.

Figure 4C:
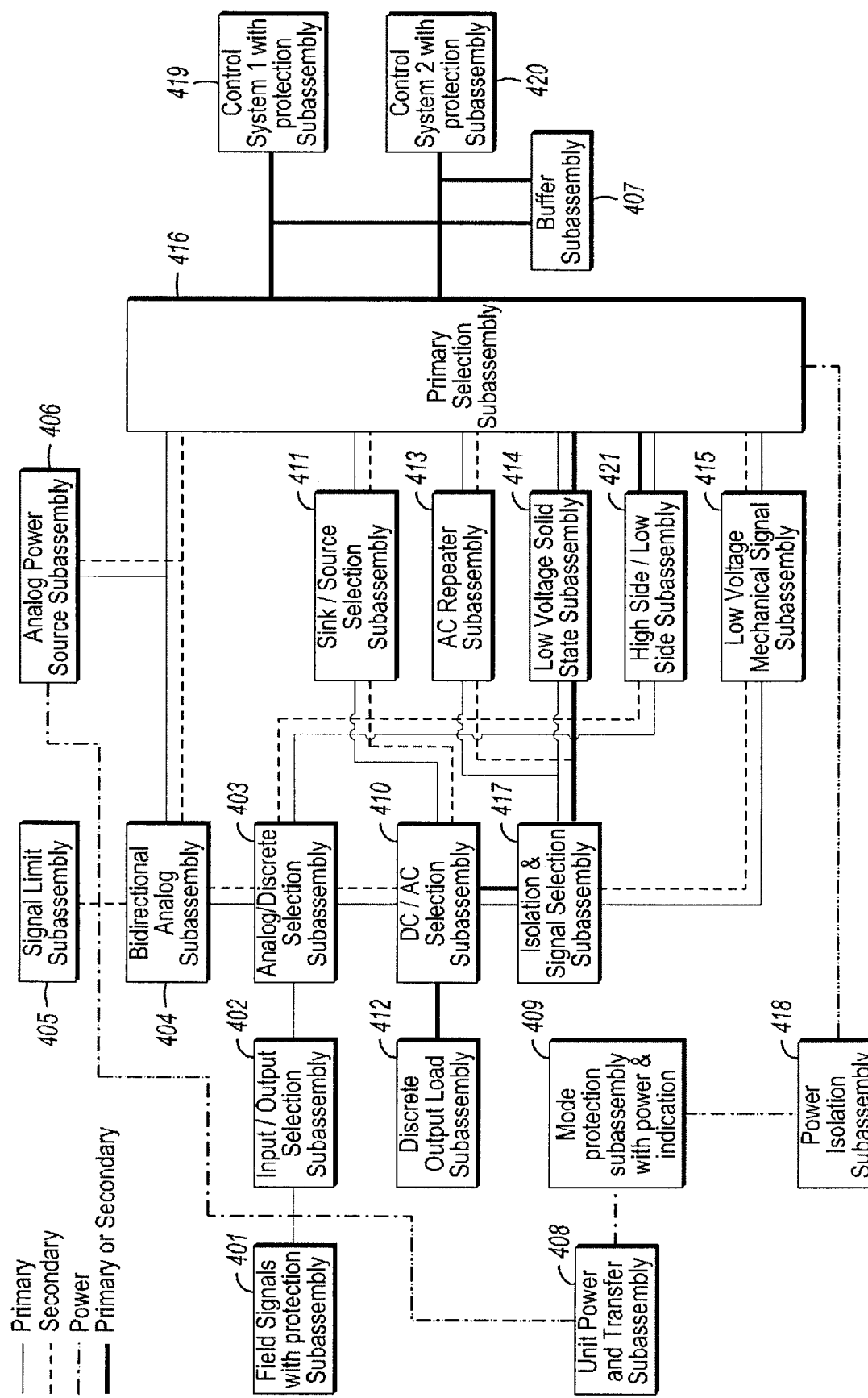
FIG. 4C is a functional block diagram of FIG. 4A showing the migration tool functioning in a discrete output mode according to another alternative.

FIG. 4C represents the installation in which a 24 V DC Discrete Output signal is sent to a field device to activate a change in state of that field device.

The primary 24V DC signal is generated from Control System 1 and is introduced to the migration tool through the Control System 1 with protection subassembly (419). The Buffer Assembly (407) may or may not be activated however in this instance it is shown as activated meaning that when. the Primary Selection subassembly (416) which is a 'break before make' design to prevent possible short circuit, is activated the last value generated is held constant during this short transition period ensuring the control systems do not see any change or loss in the signal.

Because this discrete output signal may change state rapidly, it is transmitted to the Low Voltage Solid Stand subassembly (414) onward to the Isolation and Signal selection subassembly (417) and then the DC/AC selection subassembly (410) which has been configured for DC power to the Analog/Discrete subassembly (403) which has been set to discrete, then the Input/Output selection subassembly (402) configured for output ending in the afield signals with protection subassembly (401) from where the interconnection cable connects to the field cables and eventually the field device proper.

Similar to the primary control signal from Control System 1, the secondary control signal generated by Control system 2 is introduced to the migration tool via the control system 2 protection subassembly (420) with the Buffer subassembly (407), Primary Selection subassembly (416), Low voltage solid state subassembly (414), DC/AC Selection subassembly, and Isolation and signal selection subassembly (417) operating as above. The Secondary control signal rather than continuing to the field device is routed in the DC/AC Selection subassembly (410) to the Discrete Output Load subassembly (412) so that the Secondary Control system is connected to a simulated field device, enabling both control systems to operate as they will be in actual operation.

Figure 5:
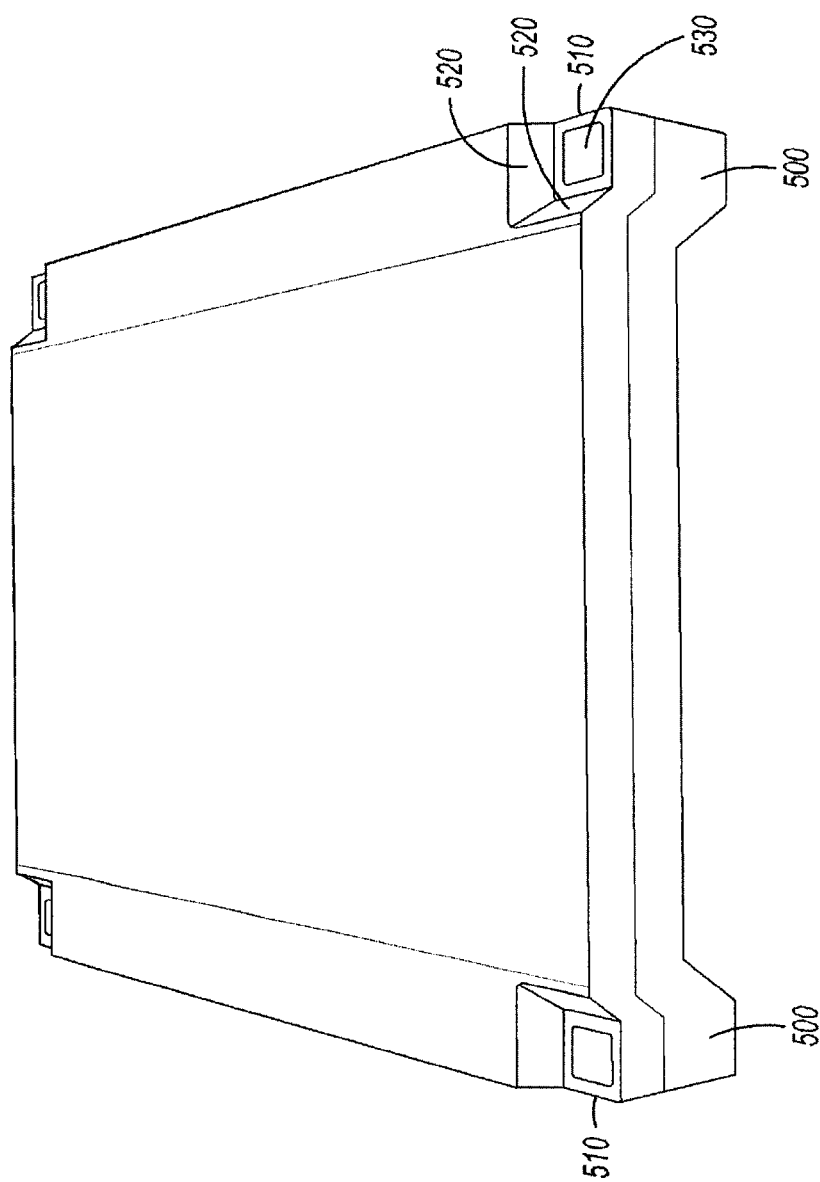
FIG. 5 is a perspective view of a single migration tool according to one alternative.

FIG. 5 provides a perspective view of a migration tool in one alternative. In this alternative, the migration tool comprises a plurality of legs (500) on the bottom thereof and a plurality of leg receivers (510) on the top thereof. In this alternative, each corner of the migration tool comprises a leg (500) extending downward. On the top of the migration tool and proximate each leg is a leg receiver (510), in this case four leg receivers, each leg receiver (510) adapted to receive a portion of a leg (500), preferably the bottom of a leg of a second migration tool, such that when stacked, each of the legs of the upper migration tool are securely received by a respective leg receiver of a lower migration tool such that the upper migration tool sits securely atop the lower migration tool. In one alternative, the leg length is such that when a migration tool is placed on a surface, there is space between the surface and the bottom of the migration tool for airflow. Furthermore, this arrangement also provides space between stacked migration tools for airflow between each migration tool. A second configuration, not shown, is the migration tool top may comprise posts that may be received by post receivers of a migration tool with post receivers proximate the bottom thereof resulting in a similar secure stacking of migration tools while allowing for air circulation. In this instance, each leg (500) is tapered downwards and each leg receiver (510) has a matingly shape to receive a leg (500). Each leg receiver comprises two walls (520) and a surface (530). Each wall (520) is angled such that the upper portion of the wall creates a wider opening than the lower portion of the wall creates with the surface (530). The angled walls further direct the legs into the correct position in the leg receivers (510) as well as securing one migration tool atop another. In one alternative, to assist in the alignment and securement of one migration tool stack atop another migration tool, surface (530) may be magnetic and bottom portion of leg (500) may be metallic, such that the bottom portion of leg (500) is attracted to magnetic surface (530) when in close proximity, and when in contact, assists in maintaining the stacked migration tools secure. In another alternative, bottom portion of leg (500) may be magnetic and surface (530) may be metallic. In yet another alternative, bottom portion of leg (500) may be magnetic of one polarity and surface (530) may be magnetic of an opposite polarity.

Figure 6:
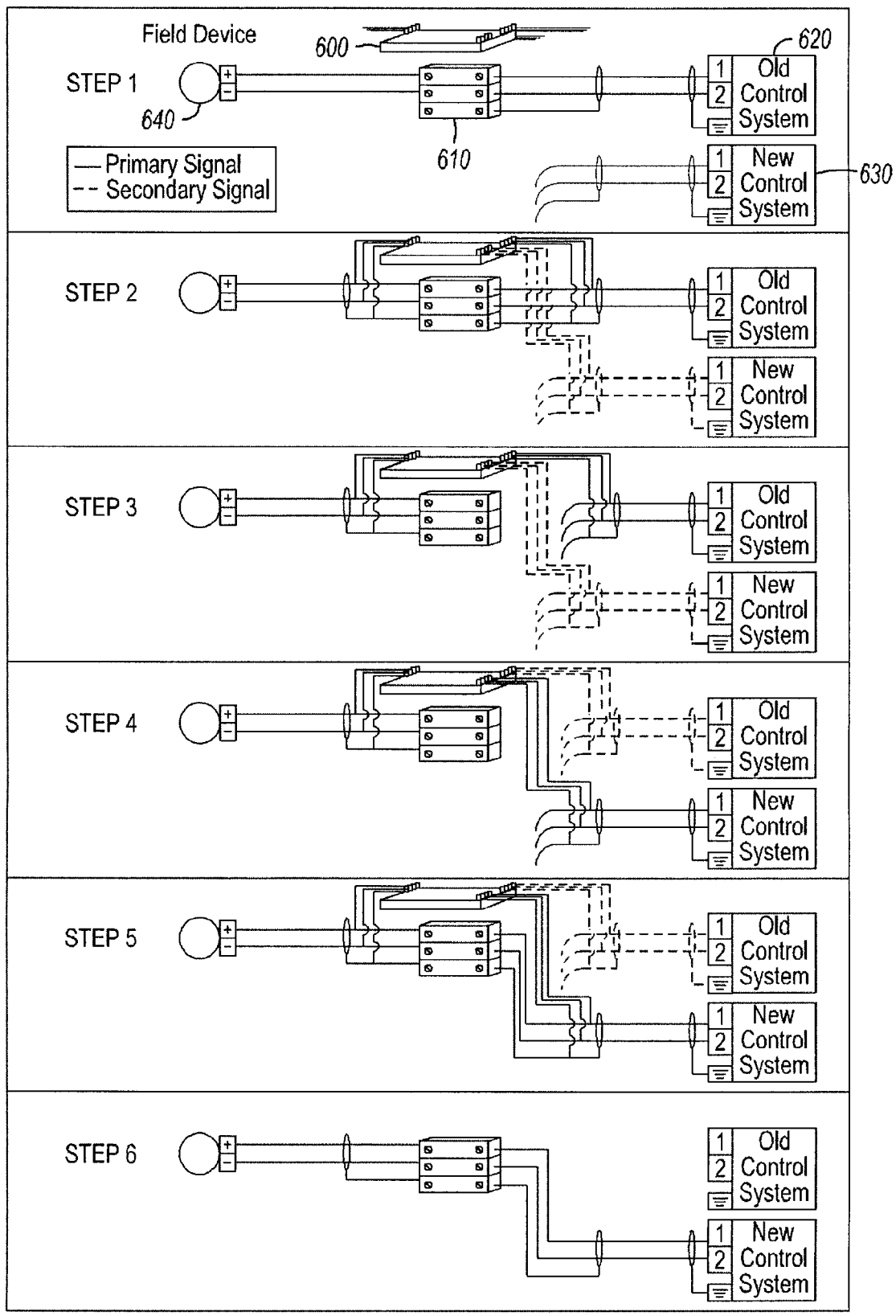
FIG. 6 depicts the series of steps for migration of a signal using the migration tool according to one alternative.

FIG. 6 provides a sequence of steps associated with a migration process as per one alternative. As best seen in FIG. 6, prior to step 1, one should ensure the mode is set for the signal or signals to be migrated. Here there is depicted a field device (640) connected to a marshalling cabinet (610) which in turn is connected to an old control system (620).

Step 1 comprises placing the migration tool (600) in place and powered. In this embodiment, proximate a marshalling cabinet (610).

Step 2. Once the power to the migration tool is applied and verified, use the pierce probes to connect to the field side of the marshalling wires. Connect the two signals wires/prefabricated cable and the ground if available and terminate the cable on the appropriate module.

Step 2.1. Connect the pierce probes to the control system side of the marshalling terminal wiring. Connect the two signal wires/prefabricated cable and the ground if available and terminate the cable on the appropriate module.

Step 2.2. Connect the pierce probes to the new control system cables inside the marshalling cabinet. Connect the two signal wires/prefabricated cable and the ground if available and terminate the cable on the appropriate module.

Step 3. Disconnect the existing wires connected directly to the terminal strip on both sides. To minimize the possibility of a short circuit or arcing incident, install a ferrule clip on each wire as it is removed from the terminal block.

Step 4. Verify that the existing system (620) and new system (630) are reading the same values.

Step 5. Once ready to switch from the existing system (620) as the primary signal to the new system (630) as the primary signal, press the appropriate selector button to make the switch.

Step 5.1. Verify that the existing system and new system are reading the same values and commission the new system while the existing system is controlling the signal.

Step 6. Wire the new system and ground wires directly to the marshalling terminals. Then wire the field signal and ground wires to the other side of the terminals.

As can be understood by a person skilled in the art, advantages of the present migration tool are that the migration tool uses the physical signals rather than a communication protocol for the migration process. In addition, there is no disruption to the I/O signals, and marshalling cabinet wiring is bypassed to allow new control system wiring to the existing marshalling terminals. Several I/O can be migrated using a plurality of synchronized migration tools. It is to be noted that the migration tool is not protocol specific and can work on any control system platform. Conventional control system input and output (I/O) types are supported. Combination of inputs, outputs, analog, discrete, isolated, non-isolated, high side, low side, 4 wire loops, 2 wire loops, device-powered and control system powered control systems and signals can be migrated using the present migration tool.

Some examples may further include additional features such as rectifier circuitry that protects and enhances the wiring options, and also enhancements to give flexibility for 4-wire wiring options, as can be understood by a person skilled in the art.

The above description allows migration of analog input, analog isolated input, analog output, analog isolated output, discrete input (from about 5 to about 30 V DC, typically 24 V DC and 120 V+/−20% AC), discrete isolated input from about 5 to about 30 V DC, typically 24 V DC and 120 V+/−20% AC), discrete output (from about 5 to about 30 V DC, typically 24 V DC and 120 V+/−20% AC), discrete isolated output (from about 5 to about 30 V DC, typically 24 V DC and 120 V+/−20% AC). Several other types of signals could be migrated, as can be understood by a person skilled in the art.

Furthermore, the use of this migration tool allows for complete commissioning and testing of a new control system before swing-over.

As can be understood by a person skilled in the art, such migration tool, or a plurality thereof, may be used for the migration of control systems such as control systems used in controlling the production equipment of a factory and telecommunication systems used for controlling and monitoring processes in a production plant or throughout a network of production plants, and any such other migration of systems that can require analog and/or discrete signal swing over.

As many changes can be made to the above-described examples, it is intended that all matter contained herein be considered illustrative of the invention and not in a limiting sense.

What is claimed is:

1. A migration tool for migrating at least one signal, associated with at least one field device, from a pre-existing control system to a new control system, comprising:
   at least one analog sub-assembly, capable of relaying said at least one signal wherein said at least one signal is an analog signal;
   at least one discrete sub-assembly capable of relaying said at least one signal wherein said at least one signal is a discrete signal;
   a first selector for switching said at least one signal between (i) an analog mode where said at least one signal is directed to said at least one analog sub-assembly, and (ii) a discrete mode where said at least one signal is directed to said at least one discrete sub-assembly;
   a second selector for selecting said at least one signal for (i) outputting to said at least one field device, or (ii) inputting from said at least one field device;
   whereas when said second selector is for selecting said at least one signal for inputting from said at least one field device, both said pre-existing control system and said new control system receive replicates of said at least one signal; and
   whereas when said second selector is for selecting said at least one signal for outputting to said at least one field device, a third selector selects said at least one signal for relaying to said at least one field device from (i) said pre-existing control system, or (ii) said new control system.

2. The migration tool of claim 1, further comprising a voltage range selector for said at least one signal which is discrete to select between an operational voltage range of 120V+/−20% AC and operational voltage range of from about 5 to about 30 V DC.

3. The migration tool of claim 2, wherein said at least one discrete sub-assembly comprises:
   a first plurality of electronic relays to repeat said at least one signal at said operational voltage range of 120V+/−20% AC; and
   a second plurality of electronic relays to repeat said at least one signal at said operational voltage range of from about 5 to about 30 V DC.

4. The migration tool of claim 1, wherein said at least one analog sub-assembly comprises at least one current loop isolation conditioner.

5. The migration tool of claim 4, wherein said at least one current loop isolation conditioner acts as its own load, to allow sensing of said at least one field device by said pre-existing control system and by said new control system.

6. The migration tool of claim 2, wherein each of said first selector, said second selector, said third selector and said voltage range selector is selected from the group consisting of a switch, software interface, touchscreen, pushbutton and combinations thereof.

7. The migration tool of claim 1, further comprising:
a signal buffering sub-assembly capable of buffering said at least one signal; and
a buffering selector to enable and disable the operation of said signal buffering sub-assembly.

8. The migration tool of claim 1, whereas said at least one analog sub-assembly and said at least one discrete sub-assembly are enclosed in a plastic housing.

9. The migration tool of claim 8, further being stackable.

10. The migration tool of claim 9, wherein said migration tool further contains at least one power connector on the at least one top and on the at least one bottom of said plastic housing to provide said migration with said electricity, so to be inter-connectable in parallel with at least one power connector of a migration tool immediately adjacent said migration tool in a stack array of migration tools.

11. The migration tool of claim 1, further comprising at least one cable for tapping into existing wiring from said at least one field device to said pre-existing control system, bypassing and replicating said at least one signal through said migration tool, allowing function testing and commissioning of said new control system while said pre-existing control system is actively controlling required outputs to said at least one field device.

12. A migration tool for replicating at least one signal, associated with at least one field device, from a pre-existing control system and a second system, comprising:
at least one analog sub-assembly, capable of relaying said at least one signal wherein said at least one signal is an analog signal;
at least one discrete sub-assembly capable of relaying said at least one signal wherein said at least one signal is a discrete signal;
a first selector for switching said at least one signal between (i) an analog mode where said at least one signal is directed to said at least one analog sub-assembly, and (ii) a discrete mode where said at least one signal is directed to said at least one discrete sub-assembly;
a second selector for selecting said at least one signal for (i) outputting to said at least one field device, or (ii) inputting from said at least one field device;
whereas when said second selector is for selecting said at least one signal for inputting from said at least one field device, both said pre-existing control system and said external system receive replicates of said at least one signal; and
whereas when said second selector is for selecting said at least one signal for outputting to said at least one field device, a third selector selects said at least one signal for relaying to said at least one field device from (i) said pre-existing control system, or (ii) said external system.

13. The migration tool of claim 12, further comprising a voltage range selector for said at least one signal which is discrete to select between an operational voltage range of 120V+/−20% AC and operational voltage range of from about 5 to about 30 V DC.

14. The migration tool of claim 13, wherein said at least one discrete sub-assembly comprises:
a first plurality of electronic relays to repeat said at least one signal at said operational voltage range of 120V+/−20% AC; and
a second plurality of electronic relays to repeat said at least one signal at said operational voltage range of from about 5 to about 30 V DC.

15. The migration tool of claim 12, wherein said at least one analog sub-assembly comprises at least one current loop isolation conditioner.

16. The migration tool of claim 15, wherein said at least one current loop isolation conditioner acts as its own load, to allow sensing of said at least one field device by said pre-existing control system and by said new control system.

17. The migration tool of claim 13, wherein each of said first selector, said second selector, said third selector and said voltage range selector is selected from the group consisting of a switch, software interface, touchscreen, pushbutton and combinations thereof.

18. The migration tool of claim 12, further comprising:
a signal buffering sub-assembly capable of buffering said at least one signal; and
a buffering selector to enable and disable the operation of said signal buffering sub-assembly.

19. The migration tool of claim 12, further comprising at least one cable for tapping into existing wiring from said at least one field device to said pre-existing control system, bypassing and replicating said at least one signal through said migration tool, allowing function testing of said at least one signal on said external system.

20. The migration tool of claim 1, further comprising one or a plurality of tapping cables, each of said tapping cables being made of a terminal that connects to the migration tool, a cable body, and a pierce probe that taps onto a wire carrying said at least one signal, whereas said probe comprises a threaded end connected to said cable body allowing said cable body to spin freely along an inside longitudinal axis of said threaded end; a needle to gain continuity with said at least one signal, operatively coupled to said cable body; and a wire clamp to hold said wire against said needle.

21. The migration tool of claim 12, further comprising one or a plurality of tapping cables, each of said tapping cables being made of a terminal that connects to the migration tool, a cable body, and a pierce probe that taps onto a wire carrying said at least one signal, whereas said probe comprises a threaded end connected to said cable body allowing said cable body to spin freely along an inside longitudinal axis of said threaded end; a needle to gain continuity with said at least one signal, operatively coupled to said cable body; and a wire clamp to hold said wire against said needle.

22. A method of migrating at least one signal from one control system to another control system using the migration tool of claim 1, said method comprising:
i) Placing the migration tool in desired location;
ii) Powering the migration tool;
iii) Connecting the migration tool to field side of a marshalling wire;
iv) Connecting a signal wire to a cable;
v) Terminating the cable to an appropriate module;
vi) Connecting a pierce probe to a first control system side of said marshalling wire;
vii) Connecting a pierce probe to a second control system side;
viii) Disconnecting the existing wiring connected to a terminal strip;
ix) Verifying that the first and second control system are reading same values and commission the second control system online while first control system is controlling the at least one signal;
x) Switching from the first control system as the primary signal to the second control system as the primary signal;

xi) Verifying that the first control system and the second control system are reading the same values;

xii) Disconnecting the first control system.

23. A method of migrating at least one signal from one control system to another control system using the migration tool of claim 12, said method comprising:

xiii) Placing the migration tool in desired location;

xiv) Powering the migration tool;

xv) Connecting the migration tool to field side of a marshalling wire;

xvi) Connecting a signal wire to a cable;

xvii) Terminating the cable to an appropriate module;

xviii) Connecting a pierce probe to a first control system side of said marshalling wire;

xix) Connecting a pierce probe to a second control system side;

xx) Disconnecting the existing wiring connected to a terminal strip;

xxi) Verifying the first and second control system are reading same values and commission the second control system online while first control system is controlling the at least one signal;

xxii) Switching from the first control system as the primary signal to the second control system as the primary signal;

xxiii) Verifying that the first control system and the second control system are reading the same values;

xxiv) Disconnecting the first control system.

24. The migration tool of claim 1, further comprising a plurality of legs.

25. The migration tool of claim 12, further comprising a plurality of legs.

26. The migration tool of claim 25, wherein said plurality of legs allows for air flow outside said migration tool.

27. The migration tool of claim 2, wherein the DC operational voltage range is 24 V DC.

28. The migration tool of claim 13, wherein the DC operational voltage range is 24 V DC.

29. The migration tool of claim 6, wherein the pushbutton comprises a light emission diode feedback and latching relay.

30. The migration tool of claim 17, wherein the pushbutton comprises a light emission diode feedback and latching relay.

31. The method of claim 22, wherein said migration tool is powered any time prior to step viii).

32. The migration tool of claim 1, further comprising a primary signal maintaining feature in the event of power loss to said migration tool.

33. The migration tool of claim 12, further comprising a primary signal maintaining feature in the event of power loss to said migration tool.

34. The migration tool of claim 28, wherein said primary signal maintaining feature is a latching relay.

35. The method of claim 23, wherein said migration tool is powered any time prior to step viii).

* * * * *